(12) United States Patent
Haratani

(10) Patent No.: US 7,453,721 B2
(45) Date of Patent: Nov. 18, 2008

(54) MAGNETIC MEMORY

(75) Inventor: Susumu Haratani, Tokyo (JP)

(73) Assignee: TDK Corporation, Tokyo (JP)

( * ) Notice: Subject to any disclaimer, the term of this patent is extended or adjusted under 35 U.S.C. 154(b) by 201 days.

(21) Appl. No.: 11/418,351

(22) Filed: May 4, 2006

(65) Prior Publication Data
US 2007/0133263 A1 Jun. 14, 2007

(30) Foreign Application Priority Data
Dec. 12, 2005 (JP) ............................. 2005-357655

(51) Int. Cl.
*G11C 11/00* (2006.01)
(52) U.S. Cl. ..................... 365/158; 365/171; 365/157
(58) Field of Classification Search .................. 365/158, 365/171, 157
See application file for complete search history.

(56) References Cited

U.S. PATENT DOCUMENTS

| 5,587,943 | A | 12/1996 | Torok et al. ................... 365/158 |
| 6,765,821 | B2* | 7/2004 | Saito et al. .................... 365/158 |
| 7,061,732 | B2* | 6/2006 | Yoshikawa et al. ...... 360/324.12 |
| 2002/0036315 | A1* | 3/2002 | Adachi et al. ................ 257/310 |
| 2003/0104636 | A1 | 6/2003 | Bloomquist et al. |
| 2004/0152227 | A1 | 8/2004 | Yoda et al. ..................... 438/48 |
| 2005/0141148 | A1* | 6/2005 | Aikawa et al. .......... 360/324.11 |
| 2005/0207263 | A1 | 9/2005 | Okayama et al. ............ 365/232 |

FOREIGN PATENT DOCUMENTS

| EP | 1560223 A2 | 8/2005 |
| JP | 11-274599 | 8/1999 |
| JP | 2000-090658 | 3/2000 |
| JP | 2004-47656 | 2/2004 |
| JP | 2004-087870 | 3/2004 |
| JP | 2004-128430 | 4/2004 |

OTHER PUBLICATIONS

Tehrani et al., Nikkei Electronics, Nov. 18, 2002, pp. 127-138 (partial English translation thereof).
Durlam et al., A 1-Mbit MRAM Based on 1T1MTJ Bit Cell Integrated with Copper Interconnect, IEEE J. Solid-State Circuit, vol. 38, 769-773 (2003).

* cited by examiner

*Primary Examiner*—Thong Q Le
(74) *Attorney, Agent, or Firm*—Mathews, Shepherd, McKay & Bruneau, P.A.

(57) ABSTRACT

A magnetic memory 1 having a wire 5 extended in a direction of arbitrary decision, an electro-resistivity effect element 4 disposed adjacently to the wire 5, and a counterelement side yoke 20B disposed adjacently on the side opposite the magneto-resistivity effect element 4 in the wire 5 and having the thickness of the counterelement side yoke 20B so set as to be larger than 50 nm and smaller than 150 nm. Owing to conformity with this invention, this magnetic memory is enabled to homogenize the magnetization property during the course of writing operation and perform the writing work with a low electric current.

14 Claims, 16 Drawing Sheets

(A)

(B)

(A)

magnitude Iw(mA) of electric current during the change of TZ

| TY_z (nm) | #1 | #2 | #3 |
|---|---|---|---|
| 50 | 2.47 | 3.30 | 2.68 |
| 100 | 2.29 | 3.02 | 2.48 |

(B)

size of test pieces (#1,#2,#3)

| Row No. | #1 | #2 | #3 |
|---|---|---|---|
| WW (um) | 0.50 | 0.80 | 0.80 |
| MX (um) | 0.50 | 0.50 | 0.80 |
| MY (um) | 0.20 | 0.20 | 0.32 |
| BX (um) | 1.50 | 1.80 | 1.80 |
| BY (um) | 0.90 | 1.15 | 1.15 |

size of test pieces (#1,#2,#3,#4)

| Row No. | #1 | #2 | #3 | #4 |
|---|---|---|---|---|
| WW (um) | 0.25 | 0.50 | 0.80 | 0.80 |
| MX (um) | 0.35 | 0.50 | 0.50 | 0.80 |
| MY (um) | 0.25 | 0.20 | 0.20 | 0.32 |
| BX (um) | 0.9 | 1.50 | 1.80 | 1.80 |
| BY (um) | 0.45 | 0.90 | 1.15 | 1.15 | magnitude Iw(mA) of the writing current of test pieces (#1,#2,#3,#4)

| TX(um) | TY(um) | TY/TX(um) | MX = 0.5 um | MX = 0.8 um |
|---|---|---|---|---|
| 1.4 | 0.5 | 0.36 | Iw= 7.18 (#1) | |
| 1.4 | 1.15 | 0.82 | Iw= 2.99 (#2) | Iw= 2.45 (#3) |
| 1.4 | 1.8 | 1.29 | | Iw= 2.51 (#4) |

Fig.13

MAGNETIC MEMORY

BACKGROUND OF THE INVENTION

1. Field of the Invention

This invention relates to a magnetic memory for storing information in a magneto-resistivity effect element.

2. Description of the Related Art

In recent years, the MRAM (Magnetic Random Access Memory) has been attracting attention as a memory cell for use in such information processing devices as computers and communication facilities. Since the MRAM is capable of memorizing data magnetically and therefore maintaining directions of magnetization without having to use any electric means, it can avoid the disadvantage of losing information due to power failure as experienced by the DRAM (Dynamic Random Access Memory) and SRAM (Static RAM) which are volatile memories. The MRAM also excels such conventional nonvolatile memories as the flash EEPROM and the hard disk device in terms of access speed, reliability, and power consumption. The MRAM, therefore, is reputed to be capable of alternating the functions of such volatile memories as DRAM and SRAM and all the functions of such nonvolatile memories as the flash EEPROM and the hard disc devices as well (refer to the official gazette of JP-A-11-274599).

In the development of an information device directed toward the so-called ubiquitous computing which enables information to be processed everywhere at the same time, the desirability of such a memory which fulfills high-speed processing and decreases power consumption as well and permits avoidance of loss of information even in the case of power failure finds general recognition. The MRAM promises to satisfy all these requirements and is expected to find adoption in numerous information devices in the future.

Particularly, cards and portable information terminals which are carried daily by users on their persons often fail to secure sufficient power supply. When a large volume of information is processed under a harsh environment of utility, therefore, even the MRAM which boasts of low power consumption is required to allow further decrease of power consumption during the course of processing information.

As one example of the technique which is capable of further decreasing power consumption in the MRAM, the magnetic memory which is published in the official gazette of JP-A2000-90658, the official gazette of JP-A2004-128430, or on page 133 of the Nov. 18, 2002 issue of the "Nikkei Electronics" is now available. This magnetic memory is provided in each of the individual memory regions (memory cells) thereof with a bit line, a word line disposed perpendicularly to the bit line, and a tunneling magneto-resistivity effect (TMR) element disposed between the bit line and the word line at the position of intersection thereof. Further, this magnetic memory is provided near the TMR element in the bit line or the word line with a yoke (magnetic field controlling layer) serving to surround the wire. The yoke is formed of a ferromagnetic body of high magnetic permeability and enabled to fulfill the role of abating the leakage of a magnetic flux from the bit line or the word line and concentrating the magnetic flux on the TMR element. As a result, the magnetic field necessary for the inversion of the state of magnetization of the TMR element can be attained even with a low power consumption. Further, the magnetic flux can be concentrated on the TMR element.

Incidentally, the TMR element is furnished with a first magnetizing layer (magnetic susceptibility layer) enabled to change the direction of magnetization by an external magnetic field, a second magnetic layer having a fixed direction of magnetization, and a non-magnetic insulating layer interposed between the first magnetic layer and the second magnetic layer and is adapted to memorizes binary data by controlling the direction of magnetization of the first magnetic layer parallel or not parallel to the direction of magnetization of the second magnetic layer.

A further study made by the present inventor, however, has ascertained that even the magnetic memory adopting the yoke is not always free from the possibility of failing to save power consumption. The yoke rather threatens such problems as needing large power consumption for generating a magnetic field and, owing to the influence of an inner magnetic field of its own, hindering magnetic memory when it happens to have a shape lacking due consideration.

Since the TMR element is so configured as to memorize binary data by inverting the direction of magnetization of the magnetic layer, it becomes important to enable the power consumption needed for the inversion of this direction of magnetization to be well balanced in the two directions pertinent herein. The low power consumption is not substantially attained, for example, where the inversion of magnetic field in one direction adds to power consumption while the inversion of magnetic field in the other direction induces a decrease of power consumption. The adoption of the yoke, therefore, has entailed the problem of complicating the control of electric current and the timing control during the course of writing operation when the directions of magnetization of the yoke are deprived of good balance.

When the yoke suffers occurrence of a multiplicity of magnetic domains therein, the variation of the states of magnetization of the bit line and the word line results in emitting Barkhausen noise, a fact which constitutes a cause for deteriorating the writing property.

This invention, originated in the light of the problems enumerated above, is directed toward abating the dispersion of the writing magnetic fields while reducing the power consumption needed during the course of writing in the magnetic memory.

SUMMARY OF THE INVENTION

With a view to accomplishing the object mentioned above, the magnetic memory according to this invention is characterized by being provided with an electric wire extended in a direction of arbitrary decision, a magneto-resistivity effect element disposed adjacently to the wire, and a counter element side yoke disposed adjacently to the side opposite the magneto-resistivity effect element in the wire. This magnetic memory is characterized by the fact that the thickness of the counter element side yoke is larger than 50 nm and meanwhile smaller than 150 nm.

If the thickness of the counter element side yoke is unduly small, the shortage will result in inevitably weakening the magnetic field generated in the counter element side yoke and no longer enabling the magneto-resistivity effect element to produce sufficiently the magnetic field needed for magnetic memory. If the thickness of the counter element side yoke is unduly large meanwhile, the excess will result in inevitably increasing the consumption of the electric current which is necessary for enabling the counter element side yoke to generate a magnetic field. By having this range conform to the present invention, therefore, it is made possible to establish ideal balance between the magnetic field generated in the counter element side yoke and the quantity of electric current consumed for this generation and ensure efficient writing of signal in the magneto-resistivity effect element.

The magnetic memory contemplated by this invention is provided with an electric wire extended in a direction of arbitrary decision, a magneto-resistivity effect element disposed adjacently to the wire, and a counter element side yoke disposed adjacently to the side opposite the magneto-resistivity effect element in the wire. This magnetic memory is characterized by the fact that the size of the counter element side yoke along the longer direction of the wire is larger than one half and smaller than two times of the size of the counter element side yoke along the crosswise direction of the wire.

By satisfying this range, the counter element yoke is enabled to have the shape thereof become narrow and long in the circumferential direction of the wire and consequently suppress the otherwise inevitable spontaneous occurrence of magnetization of (one side of) the circumferential direction of the wire inside the counter element side yoke. As a result, it is made possible to allow the magnetization generated on the outer periphery of the wire to be ideally balanced in both directions and permit the signal directed toward the magneto-resistivity effect element to be written therein efficiently at a high speed. If the counter element side yoke has an unduly long shape in the direction of extension of the wire, the excess will possibly result in inducing the formation of a magnetic domain in the counter element side yoke and preventing the change of magnetization in the yoke from proceeding smoothly (due to deterioration of response). If the element has an unduly large size, the excess will possibly result in deteriorating the responsibility of the magnetic field which is generated in consequence of the flow of electric current to the wire. When this invention is fulfilled, therefore, it is made possible to induce the generation of magnetic fields in both directions of the outer periphery of the wire efficiently with high responsibility.

Further, the magnetic memory contemplated by this invention is provided with an electric wire extended in a direction of arbitrary decision, a magneto-resistivity effect element disposed adjacently to the wire, and an element side yoke disposed on the same side as the magneto-resistivity effect element in the wire. This magnetic memory is characterized by the fact that the thickness of the element side yoke is larger than 10 nm and smaller than 30 nm meanwhile.

If the element side yoke has an unduly small thickness, the shortage will result in rendering small the magnetic field generated from the yoke and deteriorating the writing efficiency. If it has an unduly large thickness, the excess will possibly result in forming a magnetic domain in the yoke and preventing the change of magnetization of the yoke from proceeding smoothly. When this yoke fulfills the present invention, it is enabled to concentrate the magnetic field in the magneto-resistivity effect element while ensuring retention of high responsibility.

Further, the magnetic memory contemplated by this invention is provided with an electric wire extended in a direction of arbitrary decision, a magneto-resistivity effect element disposed adjacently to the wire, and an element side yoke disposed on the same side as the magneto-resistivity effect element in the wire. This magnetic memory is characterized by the fact that it satisfies the formula, $2.5<A/B<7.5$, wherein A denotes the thickness of the element side yoke mentioned above and B the thickness of the magneto-resistivity effect element.

Then, the magnetic memory contemplated by this invention is provided with an electric wire extended in a direction of arbitrary decision, a magneto-resistivity effect element disposed adjacently to the wire, and an element side yoke disposed on the same side as the magneto-resistivity effect element in the wire. This magnetic memory is characterized by the fact that the size of the element side yoke along the longer direction of the wire is set so as to be larger than one time of the size of the magneto-resistivity effect element along the longer direction of the wire and smaller than five times of the size of the magneto-resistivity effect element along the longer direction of the wire.

Also, it is provided with an electric wire extended in a direction of arbitrary decision, a magneto-resistivity effect element disposed adjacently to the wire, and a yoke structure disposed along the circumferential direction of the wire and is characterized by the fact that the thickness of the counter element side yoke formed on the side opposite the magneto-resistivity effect element in the yoke structure is so set as to be larger than the thickness of the element side yoke forming the side opposite the magneto-resistivity effect element in the yoke structure. When the magnetic memory fulfills this invention, it can efficiently provide the magneto-resistivity effect element by enabling the counter element side yoke set at a large wall thickness to attain positive repression of the leakage of the magnetic field and permitting this magnetic field to be concentrated via the element side yoke set at a small wall thickness. In this case, it is preferred that the thickness of the counter element side yoke is set so as to be larger than 50 nm and smaller than 150 nm and, at the same time, the thickness of the element side yoke is set so as to be larger than 10 nm and smaller than 30 nm.

Then, the magnetic memory contemplated by this invention is provided with an electric wire extended in a direction of arbitrary decision, a magneto-resistivity effect element disposed adjacently to the wire, and a yoke structure disposed along the circumferential direction of the wire and enabled by disposing a gap in part of the circumferential direction to accommodate the magneto-resistivity effect element in the gap and is characterized by the fact that the largest outer size of the yoke structure along the longer direction of the wire is so set that it is larger than one half and smaller than two times of the largest outer size of the yoke structure along the crosswise direction of the wire. The magnetic memory of the present invention is preferably characterized by the fact that the size of the element side yoke along the longer direction of the wire, constituting the neighborhood of the magneto-resistivity effect element in the yoke structure is set so that it is larger than one time of the size of the magneto-resistivity effect element along the longer direction of the wire and smaller than 5 times of the size of the magneto-resistivity effect element along the longer direction of the wire.

Then, the magnetic memory contemplated by this invention is provided with an electric wire extended in a direction of arbitrary decision, a magneto-resistivity effect element disposed adjacently to the wire, a counter element side yoke disposed adjacently to the side opposite the magneto-resistivity effect element in the wire, and an element side yoke disposed on the same side as the magneto-resistivity effect element in the wire. This magnetic memory is characterized by the fact that the thickness of the counter element side yoke is set so that it is larger than the thickness of the element side yoke. In this invention., it is preferred that the thickness of the counter element side yoke is set so as to be larger than 50 nm and smaller than 150 nm and, at the same time, the thickness of the element side yoke is set so that it is larger than 10 nm and smaller than 30 nm.

Further, the magnetic memory contemplated by this invention is provided with an electric wire extended in a direction of arbitrary decision, a magneto-resistivity effect element disposed adjacently to the wire, a counter element side yoke disposed adjacently to the side opposite the magneto-resistivity effect element in the wire, and an element side yoke disposed on the same side as the magneto-resistivity effect element in the wire and is characterized by the fact that the size of the element side yoke along the longer direction of the wire is so set as to be larger than one time of the size of the magneto-resistivity effect element along the longer direction of the wire and smaller than five times of the size of the magneto-resistivity effect element along the longer direction of the wire.

The magnetic memory contemplated by any of the foregoing modes of embodiment of this invention is preferably characterized by the fact that it further comprises a pair of lateral part yokes connecting the neighborhoods of the opposite terminals of the element side yoke and the neighborhoods of the opposite terminals of the counter element side yoke.

Then, the magnetic memory contemplated by this invention is provided with an electric wire extended in a direction of arbitrary decision, a magneto-resistivity effect element disposed adjacently to the wire, a counter element side yoke disposed adjacently to the side opposite the magneto-resistivity effect element in the wire, an element side yoke disposed on the same side as the magneto-resistivity effect element in the wire, and a pair of lateral part yokes connecting the neighborhoods of the opposite terminals of the element side yoke and the neighborhoods of the opposite terminals of the counter element side yoke and is characterized by the fact that the outer size of the element side yoke along the longer direction of the wire is set so as to be larger than one half and smaller than two times of the the distance between the pair of the lateral part yokes.

This invention is capable of stabilizing the magnetic field produced from the electric wire, smoothing the change of the magnetization in the yoke occurring in consequence of the change of the magnetic field, and manifesting the effect of enhancing the writing property while decreasing the power consumption.

BRIEF DESCRIPTION OF THE DRAWINGS

The above and other objects, features, and advantages of the present invention will become apparent from the following description and appended claims, taken in conjunction with the accompanying drawings.

FIG. 11 is a table diagram illustrating the change of the magnitude of electric current during the change of the thickness of the counter element side yoke of the ferromagnetic yoke structure.

FIG. 13 is a table diagram illustrating the change of the magnitude of electric current during the change of the ratio of the size of the ferromagnetic yoke structure along the longer direction of the wire and the size of the ferromagnetic yoke structure along the crosswise direction of the wire.

DETAILED DESCRIPTION OF THE PREFERRED EMBODIMENTS

Now, the mode of embodiment of the magnetic memory according to this invention will be described in detail below with reference to the accompanying drawings. In the description of the drawings, like components will be denoted by like symbols and repeated explanations will be omitted.

Figure 1:
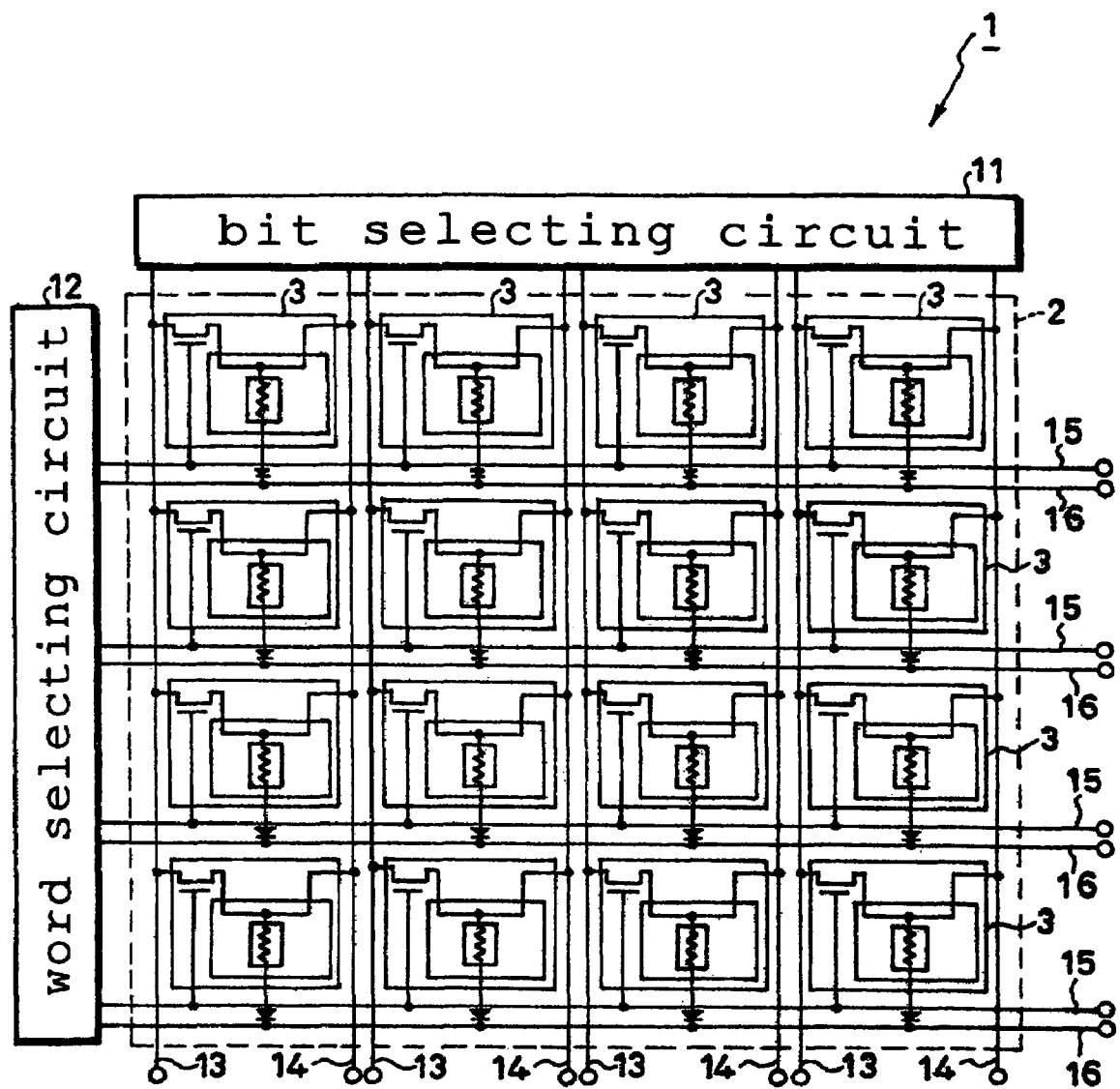
FIG. 1 is a conceptual diagram illustrating the whole structure of a magnetic memory according to the first embodiment of this invention.
Figure 2:
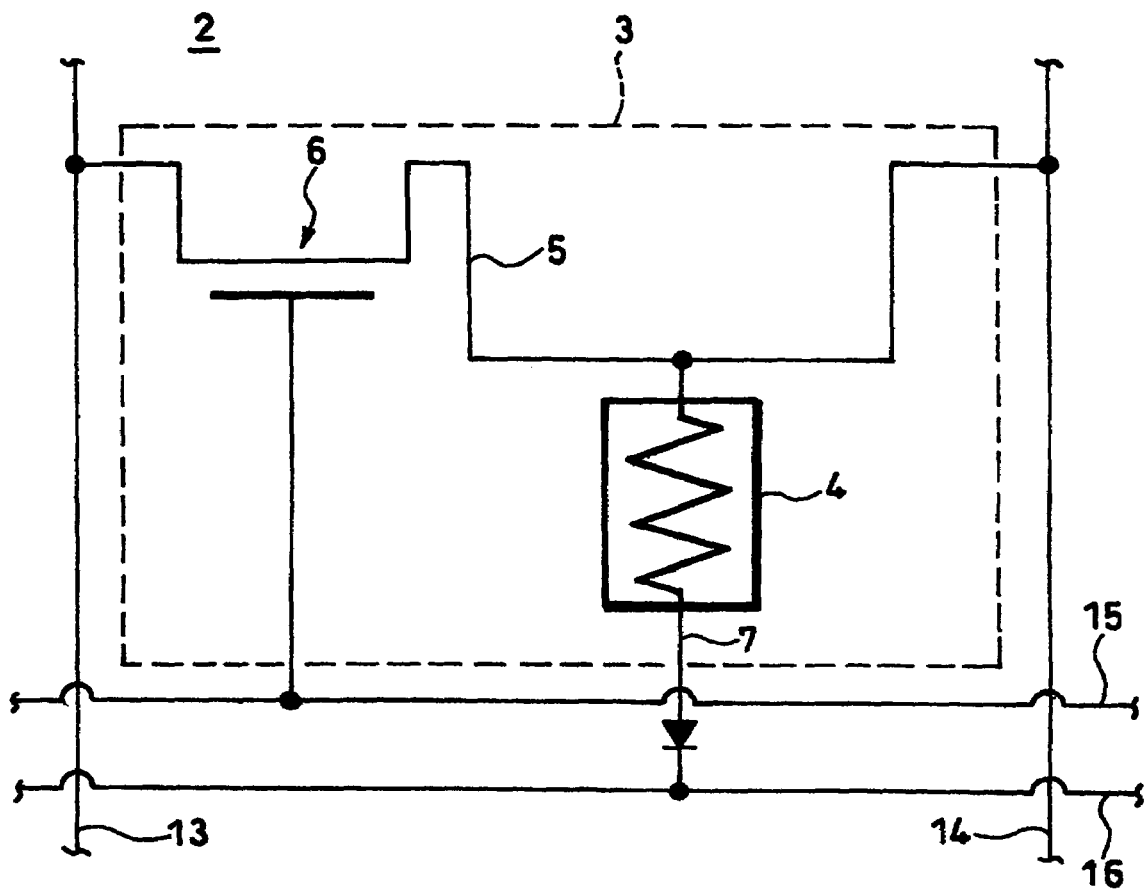
FIG. 2 is a conceptual diagram illustrating the memory cell of the magnetic memory in an enlarged scale.

FIG. 1 is a conceptual diagram illustrating the whole structure of a magnetic memory 1 according to the first embodiment of this invention. A magnetic memory 1 is provided with a memory part 2, a bit selecting circuit 11, a word selecting circuit 12, bit lines 13 and 14, and word lines 15, 16. In the memory part 2, a plurality of memory cells 3 are two-dimensionally arrayed in m lines and n rows (m and n each denoting an integer of not less than 2). As illustrated in an enlarged scale in FIG. 2, the memory regions 3 are individually furnished with a TMR element 4, a combination reading-writing wire 5, a combination reading-writing transistor 6, a reading wire 7, a ferromagnetic yoke structure 20, etc. Incidentally, the combination reading-writing wire 5 is laid so as to be led in from the bit line 13. Incidentally, since the combination reading-writing wire 5 is so laid as to be led in from the bit line 13, the memory cells 3 individually have the combination reading-writing wire 5, the ferromagnetic yoke structure 20, and the like.

The TMR (tunneling magneto-resistivity effect) element 4 possesses the function of varying the magnitude of resistance of itself on the basis of a change in the direction of magnetization. The state of change in this magnitude of resistance causes the TMR element 4 to have a binary data written therein. An external magnetic field which changes the direction of magnetization of the TMR element 4 is generated by the combination reading-writing wire 5.

One terminal of the combination reading-writing wire 5 is electrically connected to the bit line 13 via the combination reading-writing transistor 5. The other terminal of the combination reading-writing wire 5 is electrically connected to the bit line 14. The combination reading-writing transistor 6 is a switching means for controlling the passage of a writing current and a reading current in the combined reading-writing wire 5, with the combination reading-writing wire 5 connected to either of the drain and the source thereof and the bit line 13 connected to the remainder thereof. Further, the word line 15 is connected to the gate thereof. As a result, the combination reading-writing wire 5 acquires supply of electric current by means of the combination reading-writing transistor 6 and generates a magnetic field in the periphery thereof by virtue of this electric current.

The reading wire 7 has one terminal thereof connected to the TMR element 4 and the other terminal thereof to the word line 16 and has a diode interposed between the two terminals. In the TMR element 4, the supply of the reading current thereto is accomplished by connecting the combination reading-writing wire 5 to the surface opposite the side to which the word line 16 is connected. Incidentally, owing to the presence of the diode in the reading wire 7, it is made possible to prevent the flow of the wraparound current from the word line 16 toward the TMR element 4.

The bit lines 13 and 14 are disposed for each of the plurality of rows of memory cells 3 which are disposed in an arrayed pattern. The bit lines 13 are connected to the combination reading-writing transistors 6 in all the memory cells 3 belonging to the pertinent rows and connected to one-side terminals of the combination reading-writing wires 5 through the medium of the combination reading and writing transistors 6. Then, the bit lines 14 are connected to the other-side terminals of the combination reading-writing wires 5 in all the memory cells 3 belonging to the pertinent rows. The flow of electric current to the combination reading-writing wires 5 is started by permitting conduction of electricity by the combination reading-writing transistors 6 while imparting an electric potential difference between the bit line 13 and the bit line 14.

The word lines 15 and 16 are laid in the individual lines of the memory cell 3. The word lines 15 are connected to the gates of combination reading-writing transistors in all the memory cells 3 belonging to the pertinent lines. Then, the word lines 16 are connected to the TMR elements 4 via the combination reading-writing wires 7 in all the memory cells 3 belonging to the pertinent lines.

Referring back to FIG. 1, the bit selecting circuit 11 possesses the function of supplying a positive or negative writing current to the combination reading-writing wires 5 in the individual memory cells 3. Specifically, the bit selecting circuit 11 comprises an address decoder for selecting prescribed rows from the memory cells 3 disposed in an arrayed pattern in response to internally or externally designated addresses and a current drive circuit for imparting a positive or a negative electric potential difference between the bit lines 13 and 14 corresponding to the selected prescribed rows and supplying a writing current to the combination reading-writing wires 5 placed between the bit lines 13 and 14 of the prescribed rows.

The word selecting circuit 12 comprises an address decoder circuit for selecting prescribed lines from the memory cells 3 disposed in an arrayed pattern in response to internally or externally designated addresses and a current drive circuit for supplying a prescribed electric voltage to the word lines 15 and 16 corresponding to the prescribed lines. Thus, the combination reading-writing transistors 6 are enabled to acquire continuity by applying a controlling voltage to the word lines 15 corresponding to the prescribed lines by means of the words electing circuit 12. By this continuity control, the choice between feeding and not feeding the writing current to the combination reading-writing wires 5 of the addresses selected by the bit selecting circuit 11 can be determined. The word selecting circuit 12 is further enabled to control the reading current by applying a prescribed electric voltage to the word lines 16. Specifically, in the bit selecting circuit 11, the rows corresponding to the internally or externally designated addresses are selected by the address decoder circuit and a prescribed electric voltage is applied to the relevant bit lines 13. At the same time in the word selecting circuit 12, the reading current is supplied between the bit lines 13 and the word lines 16 by selecting the lines corresponding to the address by the address decoder circuit and applying the prescribed voltage to the word lines 16 corresponding to the lines. On this occasion, the conduction of the reading current is controlled on the basis of the combination reading-writing transistor 6 by applying the electric voltage also to the word lines 15 in the selected lines.

Figure 3:
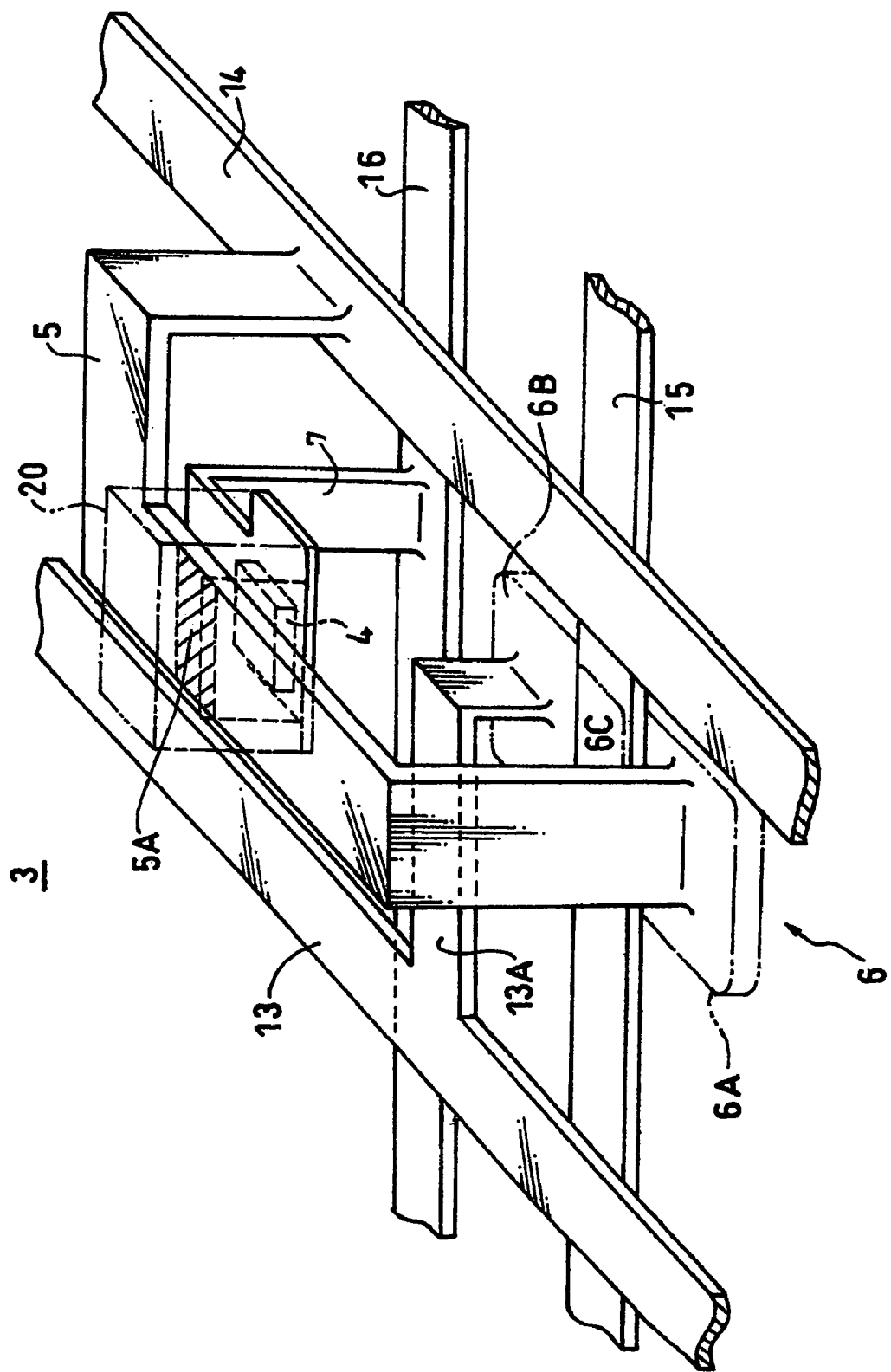
FIG. 3 is an enlarged perspective view illustrating the inner structure of the memory cell three-dimensionally.

Now, the concrete structure of the memory cell 3 in the magnetic memory 1 will be explained in detail below. FIG. 3 is a perspective view illustrating three-dimensionally the state of wire in the memory cell 3. The memory cell 3 is broadly furnished with a semiconductor layer, a wire layer, and a magnetic material layer as reckoned from the lower side. The semiconductor layer contains a semiconductor substrate which is not particularly illustrated, retains the mechanical strength of the whole memory cell 3, and forms such a semiconductor device as a combination reading-writing transistor 6. In the uppermost magnetic material layer, such structural articles of magnetic material as the TMR element 4 and the ferromagnetic yoke structure 20 adapted to impart a magnetic field efficiently to the TMR element 4 are formed. In the medially positioned wire layer, the bit lines 13 and 14, the word lines 15 and 16, part of the combination reading-writing wire 5, and the reading wire 7 are formed.

The combination reading-writing transistor 6 in the semiconductor layer is so formed as to be enclosed in an insulating region and is adapted to separate electrically the plurality of adjacent combination reading-writing transistors 6. The insulating region is formed of such an insulating material as, for example, $SiO_2$ and the semi conductor substrate is formed of an Si base, for example, and is destined to be doped with a p type or an n type impurity.

Figure 4:
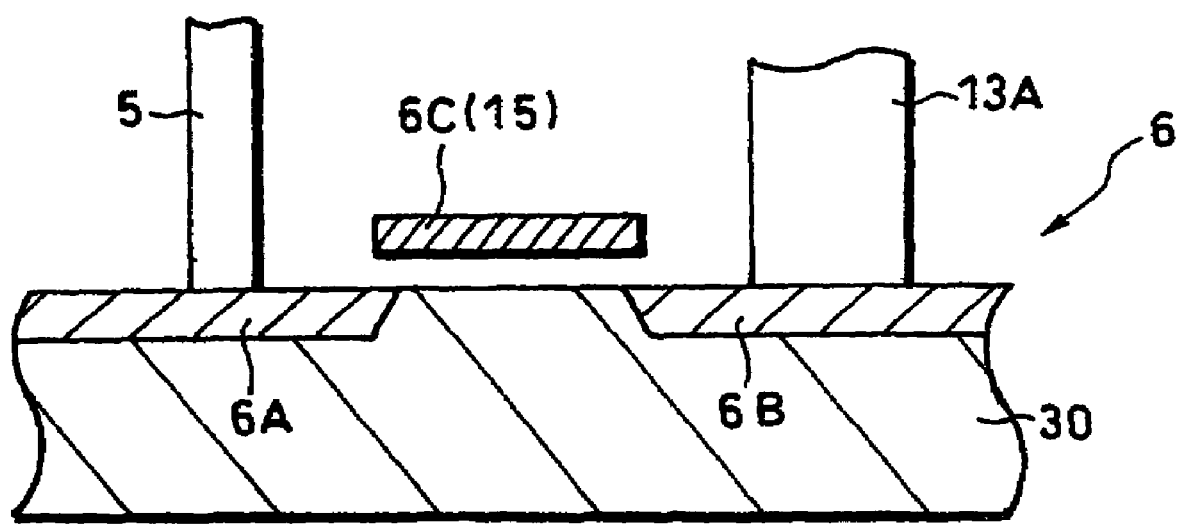
FIG. 4 is across section illustrating the structure of a transistor in the memory cell in an enlarged scale.

The combination reading-writing transistor 6, as illustrated in an enlarged scale in FIG. 4, is composed of a drain region 6A fated to constitute an inverse conduction type of a semiconductor substrate 30, a source region 6B, a gate electrode 6C, etc. As a result, the semiconductor substrate 30 intervenes between the drain region 6A and the source region 6B and the gate electrode 6C is disposed on the semiconductor substrate 30 across a prescribed gap. The gate electrode 6C is formed of the word line 15 owing to this construction, the application of an electric voltage to the word line 15 results in inducing mutual continuity of the drain region 6A and the source region 6C of the combination reading-writing transistor 6, with the result that the electric current supplied from the bit line 13 will flow to the combination reading-writing wire 5.

Referring back to FIG. 3, the region in the wire layer excluding the wires, i.e. the bit lines 13 and 14 and the word lines 15 and 16, is wholly occupied by the insulating region. As the material for the insulating region, such an insulating material as $SiO_2$ is used similarly to the insulating region of the semiconductor layer. Then, W or Al, for example, may be used as the material for the wires.

The combination reading-writing wire 5 which adjoins the TMR element 4 extends in the direction of the array surface (plane) of the memory cell 3 and assumes a shape bent on the letter L in the plane. Further, one terminal of the combination reading-writing wire 5 is bent in the direction perpendicular to the plane and enabled to form a perpendicular wire and is connected on the lower side thereof to the bit line 14. The other terminal of the combination reading-writing wire 5 is bent in the direction perpendicular similarly to the plane and made to form a perpendicular wire and is enabled at the lower terminal thereof to form an ohmic connection with the drain region 6A of the combination reading-writing transistor 6.

Then, the bit line 13 has a service wire 13A for each memory cell 3 formed as ramified in the direction of the plane and has the forward part bent in a perpendicular direction and enabled to form an ohmic connection with the source region 6B of the combination reading-writing transistor 6. The reading wire 7 is also extended in the direction of the plane, electrically connected at one terminal thereof to the TMR element 4, and bent at the other terminal in the perpendicular direction and connected on the lower side thereof to the word line 16.

The word line 15 which extends in the direction of line has part thereof concurrently serve as the gate electrode 6C. This fact is synonymous with the electric connection of the word line 15 to the gate electrode 6C of the combination reading-writing transistor 6.

Figure 5:
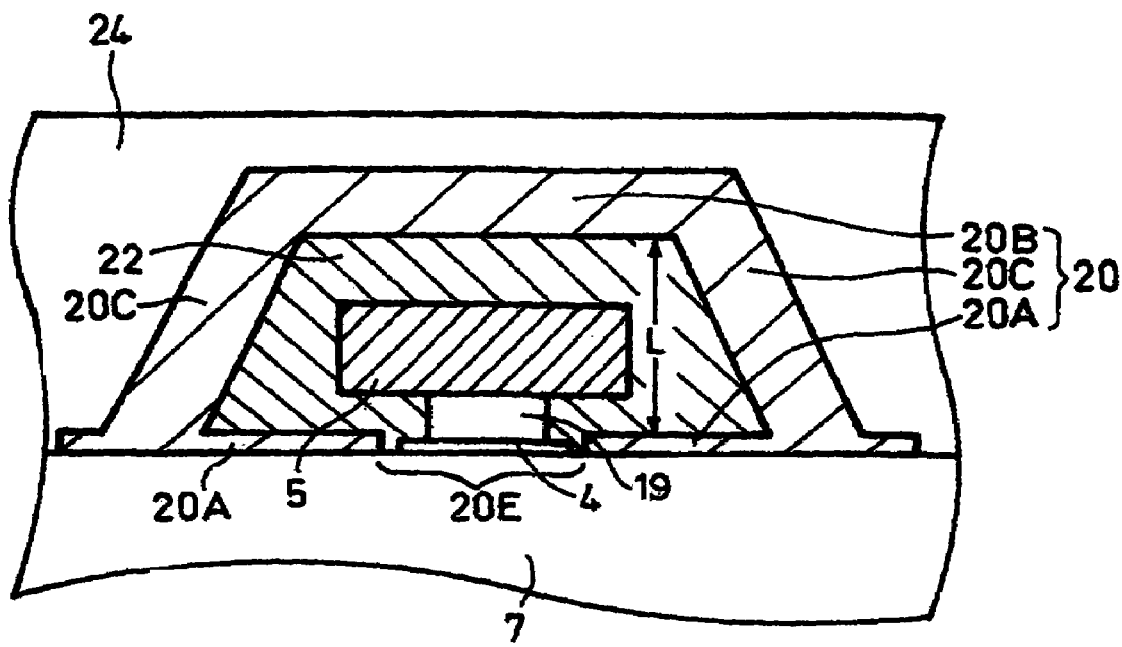
FIG. 5 is a cross section illustrating the construction of a ferromagnetic yoke structure in the memory cell in an enlarged scale.

The magnetic material layer will be explained next with reference to FIG. 5, etc. The magnetic material layer is furnished with the TMR element 4, the ferromagnetic yoke structure 20, part of the combination reading-writing wire 5, part of the reading wire 7, etc. Incidentally, in the magnetic material layer, the construction to be explained below and the region excepting the other wires are occupied by an insulating region 24.

Figure 6:
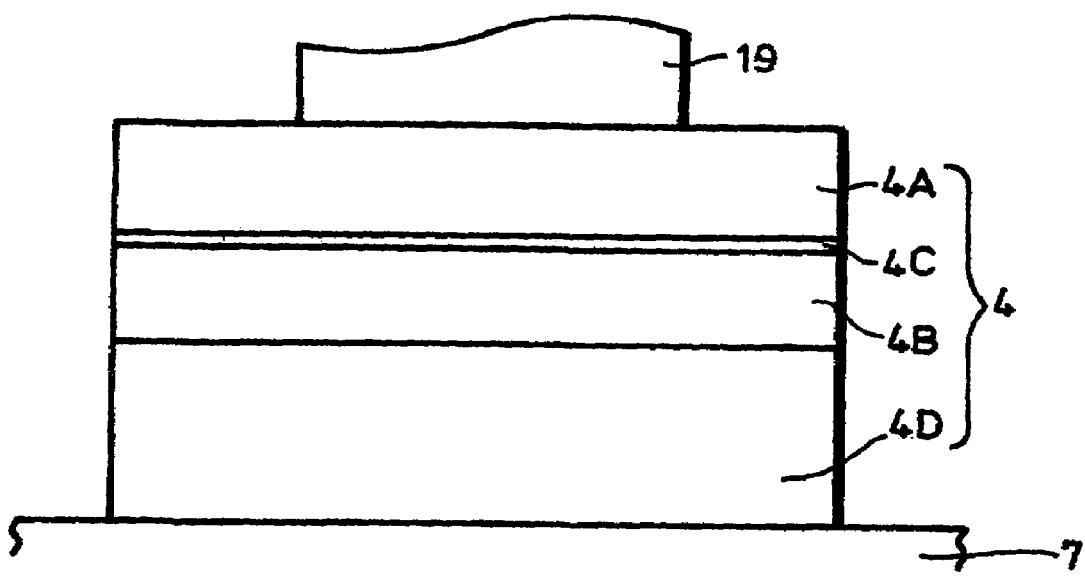
FIG. 6 is a side view illustrating the laminated structure of a magneto-resistivity effect element disposed in the magnetic layer in an enlarged scale.

The TMR element 4, as illustrated in an enlarged scale in FIG. 6, is furnished with a first magnetic layer (free layer/magneto sensitive layer) 4A having the direction of magnetization thereof varied by an external magnetic field, a second magnetic layer (pinned layer) 4B having the direction of magnetization fixed, a nonmagnetic insulating layer (insulator layer) 4C interposed between the first magnetic layer 4A and the second magnetic layer 4B, and an antiferromagnetic layer 4D adapted to fix (pin down) the direction of magnetization of the second magnetic layer 4B. This TMR element 4 has a quality such that the magnitude of resistance between the first magnetic layer 4A and the second magnetic layer 4B varies when the direction of magnetization of the first magnetic layer 4A is varied in response to an external magnetic field. By this difference in the magnitude of resistance, the binary data can be recorded. Incidentally, as the material for the first magnetic layer 4A, such a ferromagnetic material as, for example, Co, CoFe, NiFe, NiFeCo, or CoPt may be used.

The second magnetic layer 4B has the direction of magnetization thereof fixed by the antiferromagnetic layer 4D. To be specific, the direction of magnetization of the second magnetic layer 4B is stabilized as oriented in one direction by the exchange coupling in the interface between the antiferromagnetic layer 4D and the second magnetic layer 4B. The direction of the easily magnetizing axis of the second magnetic layer 4B is set along the direction of the easily magnetizing axis of the first magnetic layer 4A. As the material for the second magnetic layer 4B, such a ferromagnetic material as, for example, Co, CoFe, NiFe, NiFeCo, or CoPt maybe used. Then, as the material for the antiferromagnetic layer 4D, such a material as, for example, IrMn, PtMn, FeMn, PtPdMn, NiO, or an arbitrary combination thereof may be used.

The nonmagnetic insulating layer 4C is a layer formed of a nonmagnetic and insulative material and is interposed between the first magnetic layer 4A and the second magnetic layer 4B so as to give birth to a tunneling magneto-resistivity effect (TMR). More specifically, it has the characteristic property of varying the magnitude of electric resistance, depending on the relativity of the direction of magnetization (namely, parallel or not parallel) between the first magnetic layer 4A and the second magnetic layer 4B. As the material suitable for the nonmagnetic insulating layer 4C, the oxide or the nitride of such a metal as, for example, Al, Zn, and Mg may be used.

For the purpose of stabilizing the direction of magnetization of the second magnetic layer 4B, the second magnetic layer 4B may be replaced by a three-layer structure of second magnetic layer/nonmagnetic metal layer/third magnetic layer, though not particularly illustrated. Here, the third magnetic layer is required to contact the antiferromagnetic layer 4D. By properly setting the thickness of the nonmagnetic metal layer, the directions of magnetization of the third magnetic layer and the second magnetic layer can be retained in an antiparallel state and the direction of magnetization of the second magnetic layer can be stabilized by the exchange interaction induced by the third magnetic layer with the second magnetic layer. Though the material for the third magnetic layer does not need to be particularly restricted, such ferromagnetic materials as, for example, Co, CoF, NiFe, NiFeCo, and CoPt may be preferably used either singly or in combination. As a material suitable for the third magnetic layer, such ferromagnetic materials as, for example, Co, CoFe, NiFe, NiFeCo, and CoPt maybe used either singly or in combination. As a material for the nonmagnetic metal layer to be interposed between the second magnetic layer and the third magnetic layer, Ru, Rh, Ir, Cu, and Ag prove advantageous.

The antiferromagnetic layer 4D of the TMR element 4 is electrically connected via the metal layer 19 to the combination reading-writing wire 5. The first magnetic layer 4A of the TMR element 4 is electrically connected to the reading wire 7 owing to this construction, it is made possible to advance the reading current from the combination reading-writing wire 5 to the reading wire 7 via the TMR element 4 and to detect the change in the magnitude of resistance of the TMR element 4. Incidentally, the ferromagnetic yoke structure 20 is so disposed as to enclose a region 5A (refer to FIG. 3) adjoining the TMR element 4 in the combination reading-writing wire 5 which adjoins the TMR element 4. Incidentally, the easily magnetizing axis of the first magnetic layer 4A of the TMR element 4 is so set as to lie along the direction intersecting the longer direction of the combination reading-writing wire 5 (namely, the direction intersecting the direction of the writing current).

3 Referring back to FIG. 5, the ferromagnetic yoke structure 20 is composed of an element side yoke 20A adjacently disposed on the TMR element side in the extending combination reading-writing wire 5, a counter element side yoke 20B adjacently disposed on the side opposite the TMR element 4 in the combination reading-writing wire 5, and a pair of lateral part yokes 20C and 20C nearly looping the ferromagnetic yoke structure 20 by connection to the opposite terminals of the element side yoke 20A and the opposite terminals of the counter element side yoke 20B in order for the combination reading-writing wire 5 to pass the interior thereof.

A gap 20E is formed halfway in the inferential direction of the element side yoke 20A and the TMR element 4 is so disposed as to intervene in this gap 20E. When the ferromagnetic yoke structure is axially viewed, the lateral face of this ferromagnetic yoke structure 20 is found to cover the periphery of the combination reading-writing wire 5 and assume the shape of the letter C owing to the formation of the gap 20E in part of the circumferential direction. Thus, the accommodation of the TMR element 4 in part of the ferromagnetic yoke structure 20 serves the purpose of enabling the TMR element 4 to approach the wire 5 and the distance L between the element side yoke 20A and the counter element side yoke 20B to narrow proportionately (namely, enabling the lengths of the lateral part yokes 20C and 20C to decrease). The present embodiment has been described as having the wire 5 and the TMR element 4 electrically connected through the medium of the metallic layer 19. Optionally, the wire 5 may became an exclusive writing wire to keep the wire 5 and the TMR element 4 in a mutually insulated state and a metallic thin-film wire may be separately formed and used to ensure continuity of an exclusive reading current to one surface of the TMR element 4.

Incidentally, the insulator 22 is inserted between the ferromagnetic yoke structure 20 and the combination reading-writing wire disposed therein and between the element side yoke 20A and the TMR element 4 lest they should contact each other and give rise to an electric short.

The detailed sizes of the ferromagnetic yoke structure 20 will be explained below with reference to FIG. 7.

Figure 7:
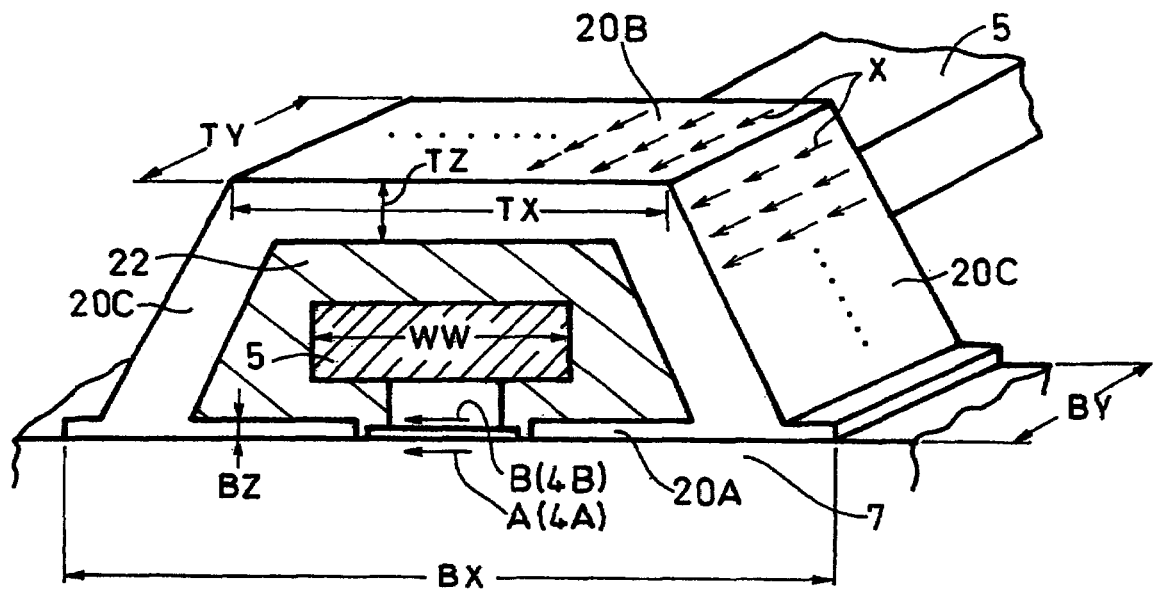
FIG. 7 is a partially cutaway perspective view illustrating as a type specimen the magnetized state of a ferromagnetic yoke structure in the magnetic layer.
Figure 7:
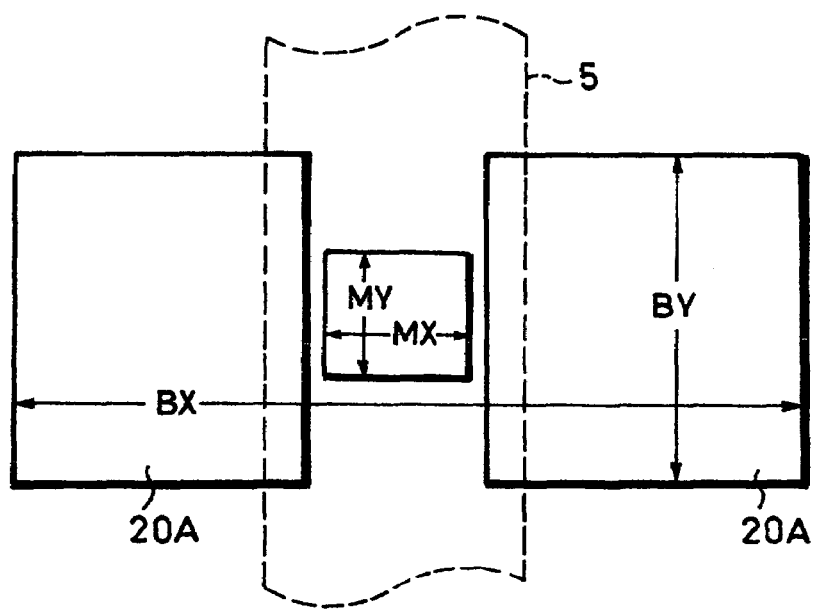

The thickness TZ of the counter element side yoke 20B, as illustrated in FIG. 7 (A), is so set as to be larger than the thickness BZ of the element side yoke 20A. Specifically, the thickness TZ of the counter element side yoke is set in a range larger than 50 nm and smaller than 150 nm and the thickness BZ of the element side yoke is set in a range larger than 10 nm and smaller than 30 nm.

Then, the size TY of the counter element side yoke 20B along the longer direction of the wire is so set as to be larger then one half and smaller than two times of the largest outer size of the ferromagnetic yoke structure 20 along the crosswise direction of the wire (namely, the size TX of the counter element side yoke 20B along the crosswise direction of the wire).

Further, the size BY of the element side yoke 20A along the longer direction of the wire, as illustrated in FIG. 7 (B), is so set as to be larger than 100 nm and smaller than 1000 nm. In relation to the TMR element 4, this size is set in a range larger than one time and smaller than five times of the size MY of the TMR element 4 along the longer direction of the wire.

Incidentally, the ferromagnetic yoke structure 20 in the present embodiment is so adapted as to form a nearly trapezoidal shape as axially viewed from the direction of extension of the combination reading-writing wire 5. In short, on the condition that the counter element side yoke 20B constitutes the upper bottom and the element side yoke 20B parallel thereto constitutes the lower bottom, the present embodiment causes the element side yoke 20A (constituting the lower bottom) to be longer than the counter element side yoke 20B (constituting the upper bottom) and, owing to this difference in size, enables the pair of lateral part yokes 20C and 20C to be tilted. Thus, particularly the upper terminal sides of the lateral part yokes 20C and 20C can now be made to approach the combination reading-writing wire 5 and, owing to this fact coupled with the addition to the wall thickness of the relevant regions, the leak of the magnetix flux on the side opposite the TMR element 4 can be effectively repressed. Further, by shortening and more tilting proportionately the lateral part yoke 20C, it is made possible to allow the lateral part yoke 20C and the counter element side yoke 20B to be manufactured integrally into a film by one series of process and permit the cost of production to be lowered as well. Incidentally, as a ferromagnetic material for forming the ferromagnetic yoke structure 20, the metal which contains at least one of the elements Ni, Fe, and Co is properly used, for example.

The operation of writing information in the TMR element 4 in the magnetic memory 1 of the present embodiment will be explained next with reference to FIG. 7-FIG. 9.

Since the magnetic field produced by the combination reading-writing wire 5 fails to occur when the flow of electric current to the combination reading-writing wire 5 is absent as illustrated in FIG. 7(A). Owing to the effect of formation of the ferromagnetic yoke structure 20, therefore, the state X of magnetization of the ferromagnetic yoke structure 20 constitutes either a single magnetic domain in a state nearly coinciding with the direction of extension of the combination reading-writing wire 5 or a plurality of magnetic domains having varying directions. Thus, the ferromagnetic yoke structure 20 is restrained from constituting a single magnetic domain in the circumferential direction of the combination reading-writing wire 5. The direction B of magnetization of the second magnetic layer 4B and the direction A of magnetization of the first magnetic layer 4A in the TRM element 4 coincide with each other here. In the present embodiment, it is defined that the binary data 0 has been written in when the directions A and B of magnetization coincide with each other.

Figure 8:
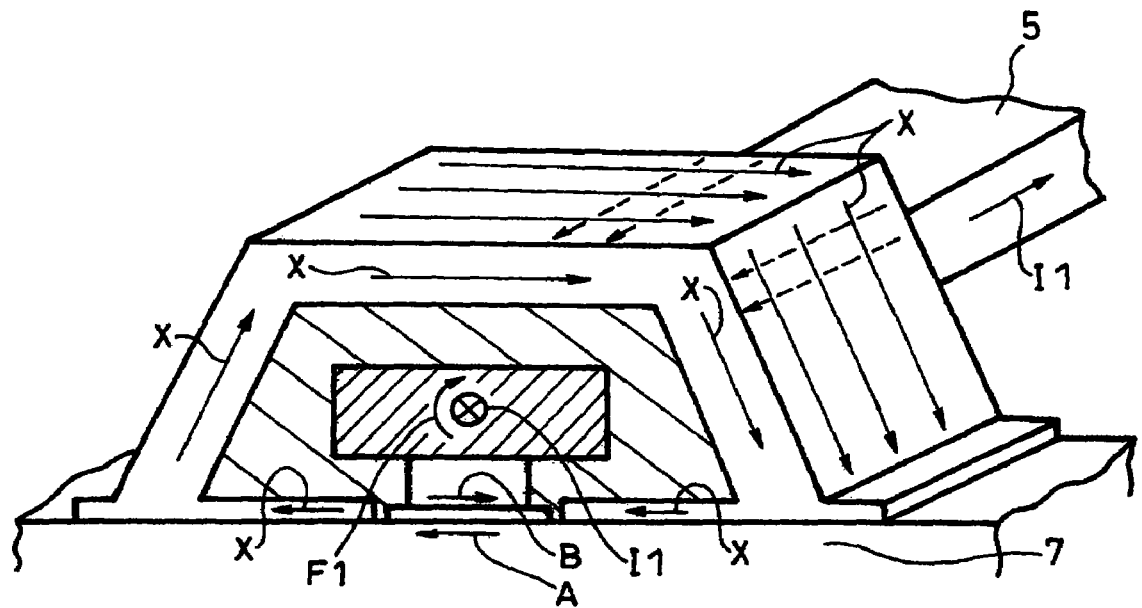
FIG. 8 is a partially cutaway perspective view illustrating as a type specimen the magnetized state of the ferromagnetic yoke structure in the magnetic layer.

When the writing current I1 flows to the combination reading-writing wire 5 as illustrated in FIG. 8, a circumferentially directed magnetic field F1 is produced around the combination reading-writing wire 5. The magnetic field F1 turns round the interior of the ferromagnetic yoke structure 5 disposed on the periphery thereof and consequently forms a closed route. The state X of magnetization of the ferromagnetic yoke structure 20, in such a manner as guided by this magnetic field F1, causes the direction of magnetization to be smoothly rotated by 90 degrees till it coincides with the direction of the magnetic field F1 in spite of the influence of the inner magnetic field. On this occasion, the leak of the magnetic field F1 can be effectively repressed and guided to the TMR element 4 because the counter element side yoke 20B is formed in a large wall thickness.

As a result, a strong magnetic field resulting from the synthesis of the state F1 of magnetization produced from the combination reading-writing wire 5 and the state X of magnetization produced in the ferromagnetic yoke structure 20 is concentrated in the element side yoke 20A of a small wall thickness and consequently made to act on the first magnetic layer 4A in the TMR element 4 and induce reversion of the direction A of magnetization thereof. When the flow of the electric current I1 of the combination reading-writing wire 5 is suspended in this state, the state X of magnetization of the TMR element 4 is retained in the inverted state as illustrated in FIG. 8. Since the directions A and B of magnetization are retained in the opposed states, the binary data 1 is written in here.

Figure 9:
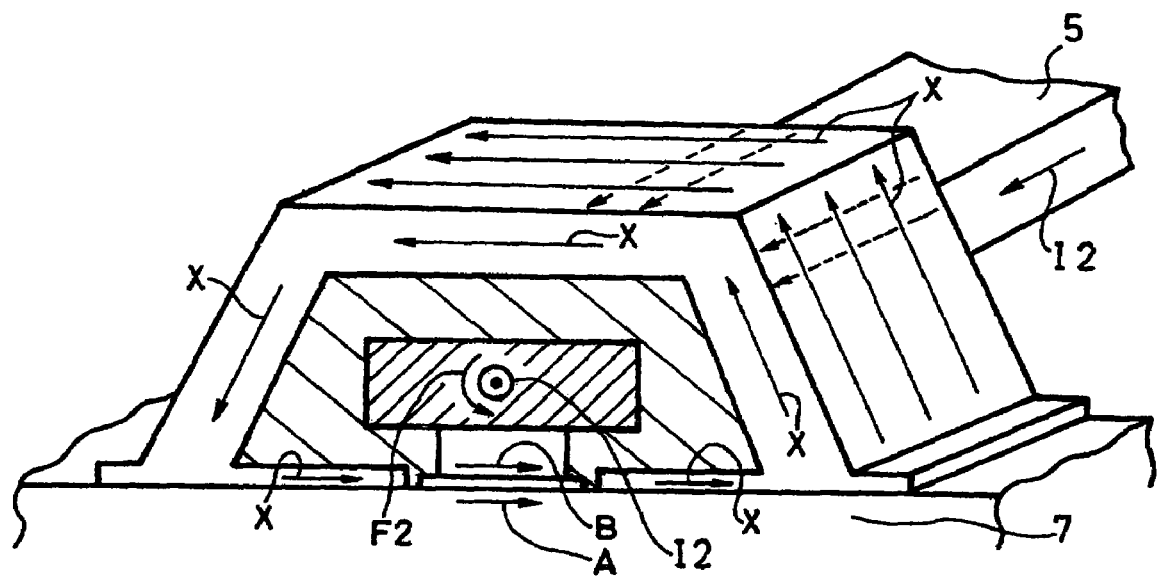
FIG. 9 is a partially cutaway perspective view illustrating as a type specimen the magnetized state of the ferromagnetic yoke structure in the magnetic layer.

When the writing current I2 flows next in the direction opposite the current I1 in the combination reading-writing wire 5 as illustrated in FIG. 9, a peripherally directed magnetic field F2 is generated around the combination reading-writing wire 5. The magnetic field F2 forms a closed route which turns round the interior of the ferromagnetic yoke structure 20 formed in the periphery thereof. The state X of magnetization of the ferromagnetic yoke structure 20, as guided by this magnetic field F2, causes the direction of magnetization to be smoothly rotated by 90 degrees till it coincides with the direction of the magnetic field F2.

As a result, the state F2 of magnetization produced from the combination reading-writing wire 5 and the state X of magnetization produced in the ferromagnetic yoke structure 20 are synthesized and the strong magnetic field consequently formed acts on the first magnetic layer 4A in the TMR element and reverses the direction A of magnetization till it coincides again with the direction B of magnetization of the second magnetic layer 4B. The TMR element 4, owing to the coincidence of the directions A and B of magnetization, results in writing the binary data 0 again here.

Incidentally, in the case of reading the binary data which has been written in the TMR element, the reading current is passed between the combination reading-writing wire 5 and the reading wire 7 and the change in the magnitude of the electric current or the change in the electric potential difference between the two wires is detected. This process reveals the magnitude of resistance of the TMR element 4 and determines whether or not either of the two binary data has been recorded (i.e. by discriminating as to whether the direction A of magnetization of the first magnetic layer 4A and the direction B of magnetization of the second magnetic layer 4B are parallel or not parallel with each other). When the direction A of magnetization of the first magnetic layer 4A coincides with the direction B of magnetization of the second magnetic layer 4B, for example, the magnitude of resistance between the first magnetic layer 4A and the second magnetic layer 4B becomes comparatively small owing to the tunneling magneto-resistivity effect (TMR) in the nonmagnetic insulating layer 4C. Conversely, when the direction A of magnetization and the direction B of magnetization fall in the reversed directions, the magnitude of resistance between the first magnetic layer 4A and the second magnetic layer 4B becomes comparatively large owing to the tunneling magneto-resistivity effect.

Figure 10:
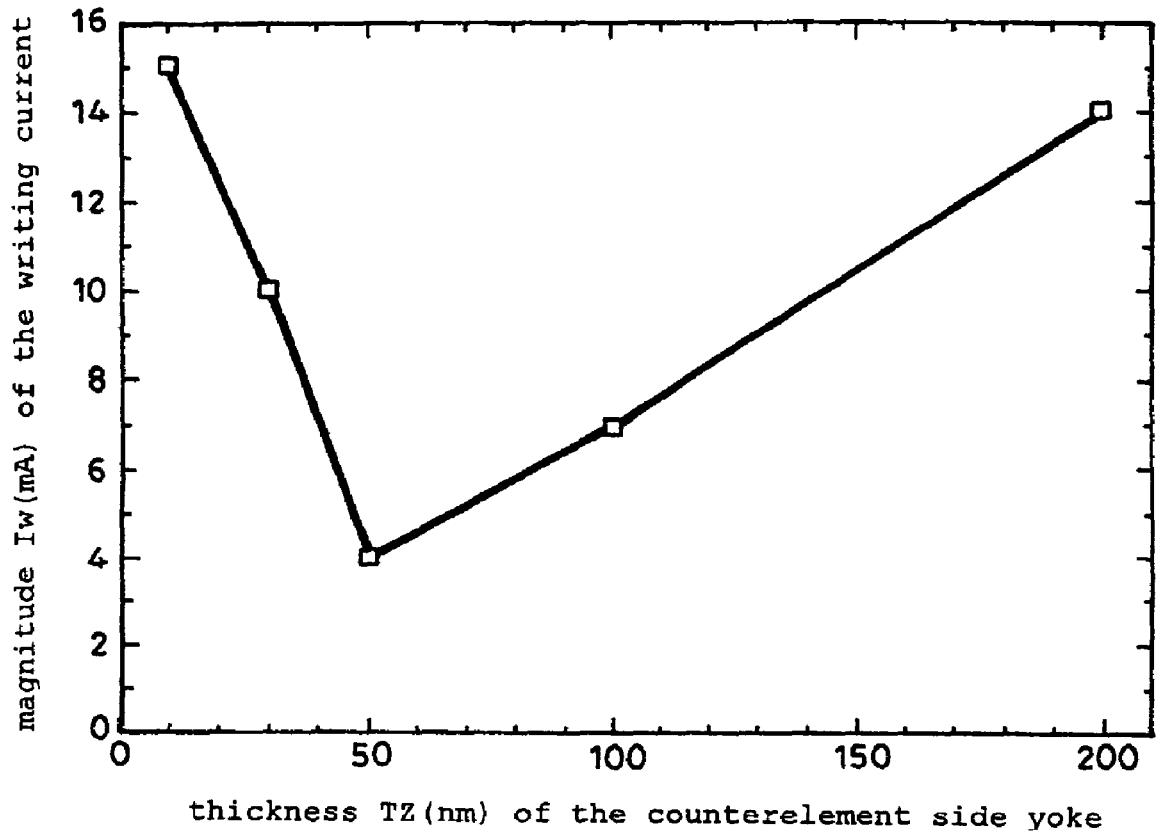
FIG. 10 is a diagram of simulation illustrating the change of the magnitude of electric current during the change of the thickness of the counter element side yoke of the ferromagnetic yoke structure.

FIG. 10 is a graph simulating the change in the magnitude Iw (mA) of the writing current caused in the ferromagnetic yoke structure 20 when the thickness TZ (nm) of the counter element side yoke 20B is changed. From the results given in the graph, it is clear that the writing current Iw is minimized when the thickness TZ is set near 50 nm. It is also clear that the writing current Iw suddenly increases when the thickness falls short of 50 nm. It is further clear that when the thickness TZ increases beyond 150 nm, the writing current Iw inevitably surpasses 10 mA and becomes unfit for practical use. It is, therefore, clear that the thickness TZ of the counter element side yoke 20B is set in a range larger than 50 nm and smaller than 150 nm and more preferably in a range larger than 50 nm and smaller than 100 nm. Incidentally, the present simulation has adopted the case of setting the width WW of the combination reading-writing wire 5 at 500 nm, the size TX of the TMR element 4 along the crosswise direction of the wire at 200 nm, the size TY along the longer direction of the wire thereof at 200 nm, the size BX of the element side yoke 20A along the crosswise direction of the wire at 1500 nm, and the size BY of the element side yoke 20A along the longer direction of the wire at 900 nm.

FIG. 11(A) shows the results of a test performed by preparing three test pieces (#1, #2, #3), setting the thickness TZ of the counter element side yoke 20B in the ferromagnetic yoke structure 20 of each sample at either of the two values, 50 nm and 100 nm, and measuring the magnitude Iw of writing current. In all the test runs, the magnitudes of current were not more than 4 (mA), a fact which proves that the writing can be performed with a very small electric current. Since the other sizes of the ferromagnetic yoke structure 20 in the three test pieces are shown in FIG. 11 (B) and will be omitted from the following explanation.

The primary factor inducing such a phenomenon as this may be ascribed to the following things. When the thickness of the counter element side yoke 20B is unduly small, the magnetic field produced in the counter element side yoke is inevitably weakened because of a drop of the effect of repressing the leak of a magnetic field and the magneto-resistivity effect element is not enabled to produce sufficiently the magnetic field needed for magnetic memory. When the thickness of the counter element side yoke 20B is unduly large, the electric power consumed is inevitably increased because the counter element side yoke 20B is made to suffer an increase in the energy needed for producing an inner magnetic field. By causing the range to conform to the present mode of embodiment, therefore, the magnetic field produced by the counter element side yoke 20B and the electric power consumed for this production are ideally balanced.

Then, in FIG. 12(A), the changes of the magnitude Iw (mA) of writing current found in a test performed by preparing four test pieces (#1, #2, #3, #4) and varying the thickness BZ (nm) of the element side yoke 20A in the ferromagnetic yoke structure 20 of each sample. From the results of this test, it is clear that in all the test pieces except the test piece (#2), the writing current Iw was minimized when the thickness BZ was set near 20 nm. Consequently, it proves preferable to have the thickness BZ of the element side yoke set in a small range which has 20 nm as an intermediate value and is larger than 10 nm and smaller than 30 nm. Since the other sizes of the ferromagnetic yoke structure 20 in the four test pieces are shown in FIG. 12(B) and will be omitted from the following explanation.

Regarding the element side yoke 20A, similarly to the counter element side yoke 20B, the unduly small thickness results in decreasing the magnetic field generated from the leading terminal and lowering the writing efficiency. Meanwhile, the unduly large thickness possibly results in suffering the ferromagnetic yoke structure 20 to form a magnetic domain therein and preventing the element side yoke 20A from smoothly changing the magnetization of the leading terminal.

Figure 12:
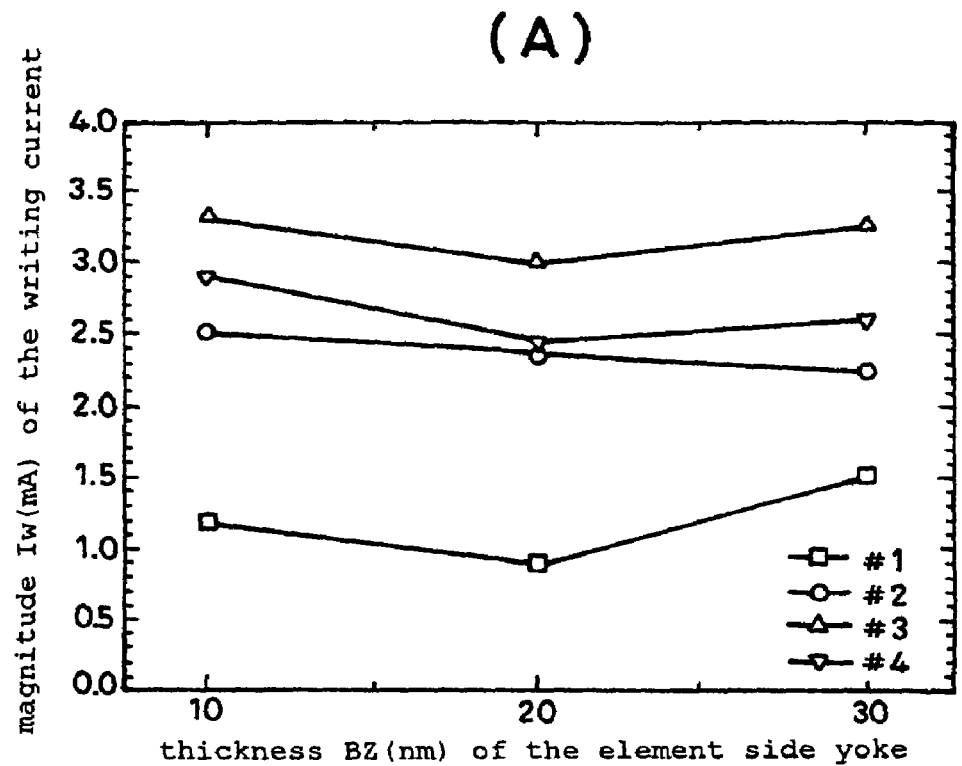
FIG. 12 is a table diagram illustrating the change of the magnitude of electric current during the change of the thickness of the element side yoke of the ferromagnetic yoke structure.

From the results shown in FIG. 11 and FIG. 12, however, it is clear that the optimal thickness of the element side yoke 20A is smaller as a whole than the optimal thickness of the counter element side yoke 20B. By causing the thickness BZ of the element side yoke 20A to be smaller than the thickness TZ of the counter element side yoke 20B, therefore, it is made possible to repress positively the leak of the magnetic field on the counter element side yoke 20B, guide the magnetic field toward the element side yoke 20A, and efficiently apply this magnetic field to the TMR element 4 with quick responsibility in the element side yoke 20A formed in a small wall thickness.

In FIG. 13, the state of change of the magnitude Iw (mA) of writing current found in a test performed by preparing four test pieces (#1, #2, #3, #4), setting the size TX of the counter element side yoke 20B along the crosswise direction of the wire in the ferromagnetic yoke structure 20 of each sample at 1.4 μm (1400 nm), and varying the size TY of the counter element side yoke 20B along the longer direction of the wire. It is clear from the diagram that the writing current Iw inevitably increases unduly when the ratio TY/TX falls short of 0.5. Incidentally, since the size TX of the counter element side yoke 20B along the crosswise direction of the wire and the size BX of the element side yoke 20A along the same direction are nearly equal in the present test pieces, the results of the test shown above are equal when the size BX is used instead.

When the overall shape of the counter element side yoke 20B is short in the longer direction of the combination reading-wriging wire 5 and unduly long in the crosswise direction, it inevitably results in inducing spontaneous formation of an inner magnetic field of the circumferential direction of the combination reading-writing wire 5 in the counter element side yoke 20B and nulling the neutrality of the inner magnetic field. It is, therefore, inferred that by causing TY to be larger than one half of BX as in the present mode of embodiment, it is made possible to repress the occurrence of the inner magnetic field of the circumferential direction, enable the magnetic fields in both circumferential directions to be quickly and evenly formed even when the electric current flows in both directions to the combination reading-writing wire 5, and keep the power consumption low. If the ratio TY/BX increases beyond 2, the excess will result in suffering the ferromagnetic yoke structure 20 to elongate unduly, a fact which proves irrational in consideration of the area of the TMR element 4.

Figure 14:
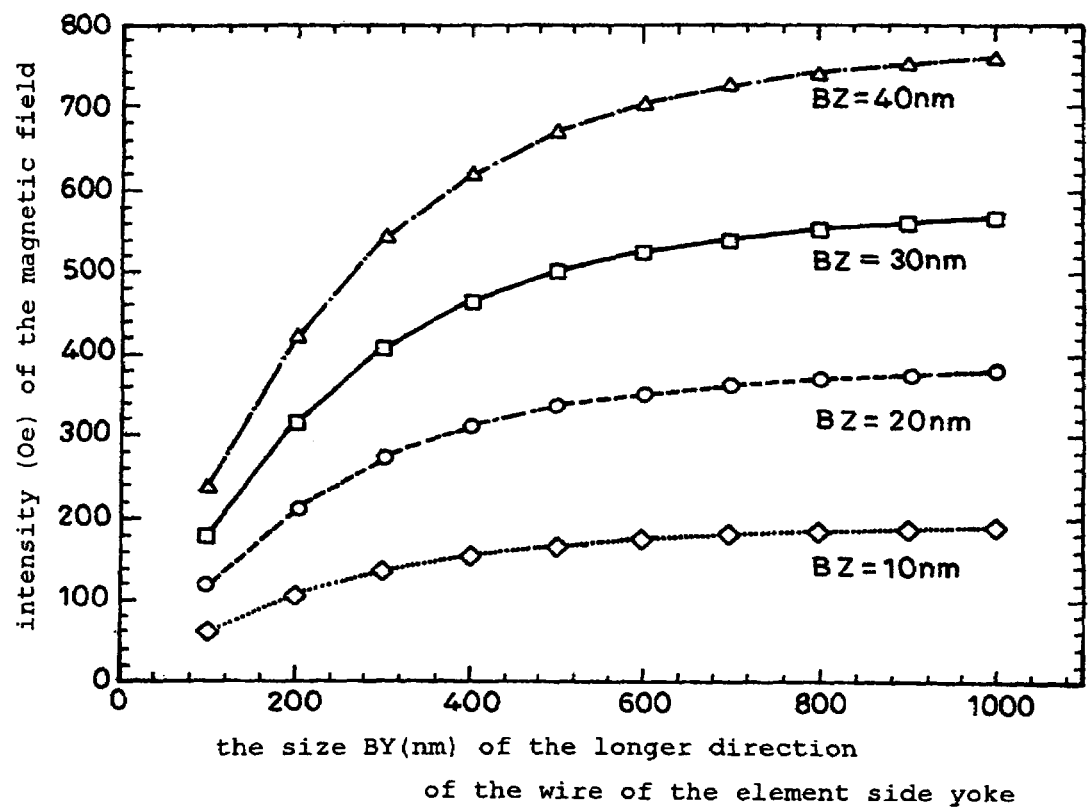
FIG. 14 is a table diagram illustrating the change of the magnitude of electric current during the change of the size of the element side yoke in the ferromagnetic yoke structure along the longer direction of the wire.

FIG. 14 shows the results of simulation of the intensity (Oe) of the magnetic field acting on the center of the gap 20E (namely, the center of the TMR element 4) obtained in a test performed by setting the thickness BZ of the element side yoke 20A at four values, 10 nm, 20 nm, 30 nm, and 40 nm and varying the size BY of each test run along the longer direction of the wire. This simulation is based on a calculation performed by setting the intensity of the magnetic field produced from the ferromagnetic yoke structure 20 at 800 (emu/cc) and the distance of the gap accommodating the TMR element 4 at 320 nm.

According to FIG. 14, when the size BY of the element side yoke 20A along the longer direction of the wire falls short of 100 nm, the shortage results in suddenly lowering the intensity of the magnetic field, a fact which proves unfit for writing information. Further, the inclination of this fall increases beyond the boundary of 200 nm. Meanwhile, when the size BY along the longer direction of the-wire increases beyond 1000 nm, the excess results in nearly fixing the intensity of the magnetic field. By setting the range of 100 nm<BY<1000 nm, and preferably the range of 200 nm<BY<1000 nm, therefore, it is made possible to attain an ideal magnetic field. Frequently, as the size MX of the TMR element 4 along the longer direction of the wire, the length falling in the neighborhood of 200 nm is adopted. In consideration of the relation with the size MX of the TMR element 4 along the longer direction of the wire, it proves effective to set the size BX of the element side yoke 20A along the longer direction of the wire in a range larger than one half of MX and smaller than five times thereof, and more preferably in a range larger than one time and smaller than five times thereof In consequence of the fact that BX becomes larger than one half of MX (preferably larger than one time thereof), the power saving can be accomplished because the writing magnetic field is enabled to act on the central region of the TMR element 4 and the element side yoke 20A is prevented from becoming unduly large insignificantly by setting BY at a value smaller than five times of MY.

According to the magnetic memory 1 described above, the magnetic field of great strength can be obtained with a low power consumption because the ferromagnetic yoke structure 20 is configured in a prescribed shape. Further, in the case of having a plurality of memory cells 3 disposed in an arrayed pattern as illustrated in FIG. 1, the magnetic field property obtained by the combination reading-writing wire 5 and the ferromagnetic yoke structure 20 can be homogenized and the writing control can be facilitated.

In the case of such an independent structure which has combination reading-writing wires 5 for use in individual memory cells 3 led in from the bit line 13 and has the individual combination reading-writing wires 5 severally form ferromagnetic yoke structures 20, for example, the magnetization properties exhibited by the plurality of the ferromagnetic yoke structures generally tend to induce dispersion among themselves. When the ferromagnetic yoke structure 20 is configured in a prescribed shape as in the present magnetic memory 1, however, the magnetic field property can be stabilized and the writing speed, etc. can be homogenized among the plurality of memory cells 3.

Then, when the ferromagnetic yoke structure 20 is disposed in the combination reading-writing wire 5, since the circular direction of the ferromagnetic yoke structure 20 constitutes a longer direction for the ferromagnetic yoke structure 20, the magnetic domains are liable to be formed mainly in the longer direction. By having the ferromagnetic yoke structure 20 configured in a prescribed dimensional ratio as in the present embodiment, it is made possible to repress the occurrence of an inner magnetic field in the peripheral direction and diminish such imbalances as inducing a difference between one writing speed and the other writing speed in the binary writing and a difference between the magnitude of current-voltage needed on one side and the magnitude of current-voltage needed on the other side.

Figure 15:
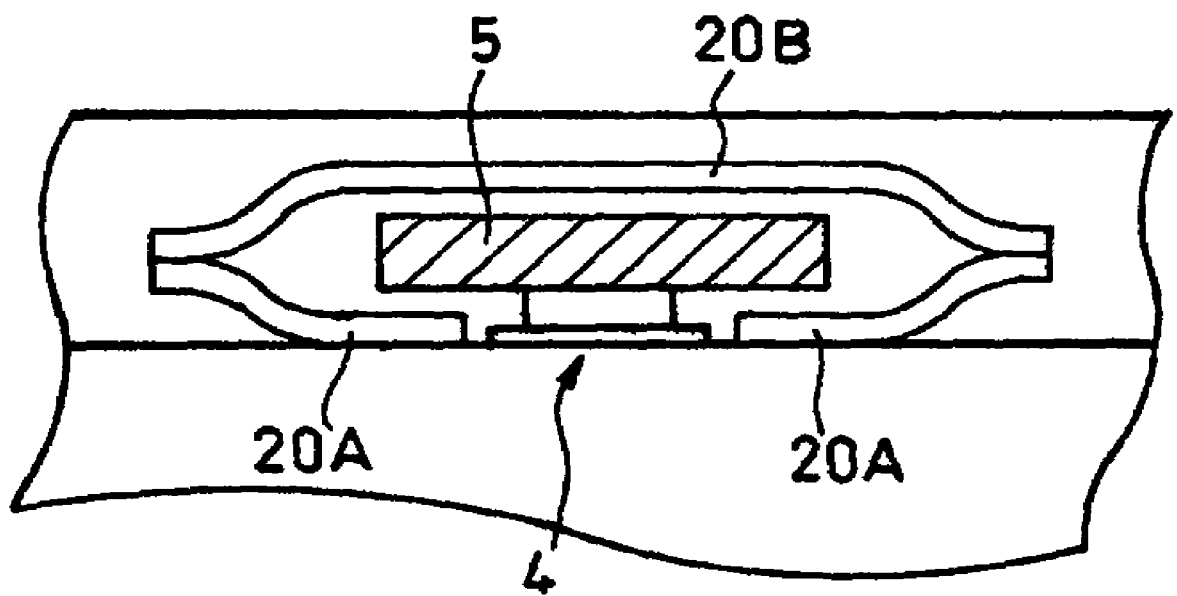
FIG. 15 is a side view illustrating another example of the construction of the magnetic memory.

Then, in the present magnetic memory 1, by further decreasing the wall thickness of the wire S, the memory cell 3 can be thinned as a whole. In this case, the ferromagnetic yoke structure 20 can also be directly connected end to end in a circular structure by slightly tilting the opposite terminals of the element side yoke 20A or the counter element side yoke 20B as illustrated in FIG. 15. By omitting the step of forming the lateral part yoke 20C and forming the ferromagnetic yoke structure 20 in accordance with the first yoke film process intended to form the element side yoke 20A and the second yoke film process intended to form the counter element side yoke 20B as described above, it is made possible to decrease extremely the overall thickness of the ferromagnetic yoke structure 20 and decrease the wall thickness of the ferromagnetic yoke structure 20 as well. In this case, the lateral part yoke 20C cannot be necessarily located definitely. On this occasion, it suffices to regard the points of contact of the element side yoke 20A and the counter element side yoke 20B as the lateral part yokes 20C and 20C and adopt the largest distance between the lateral part yokes 20C and 20C as the largest size of the ferromagnetic yoke structure 20 along the crosswise direction of the wire.

Incidentally, the expression "the gap formed on the element side yoke" as used in the present invention refers to the final shape assumed by the ferromagnetic yoke structure 20 and does not need to be limited to the case of continuously forming the element side yoke 20A and thereafter performing a dividing work for the purpose of forming the gap. It is permissible, for example, to form a pair of element side yokes 20A independently of each other and interpose the TMR element therebetween.

Figure 16:
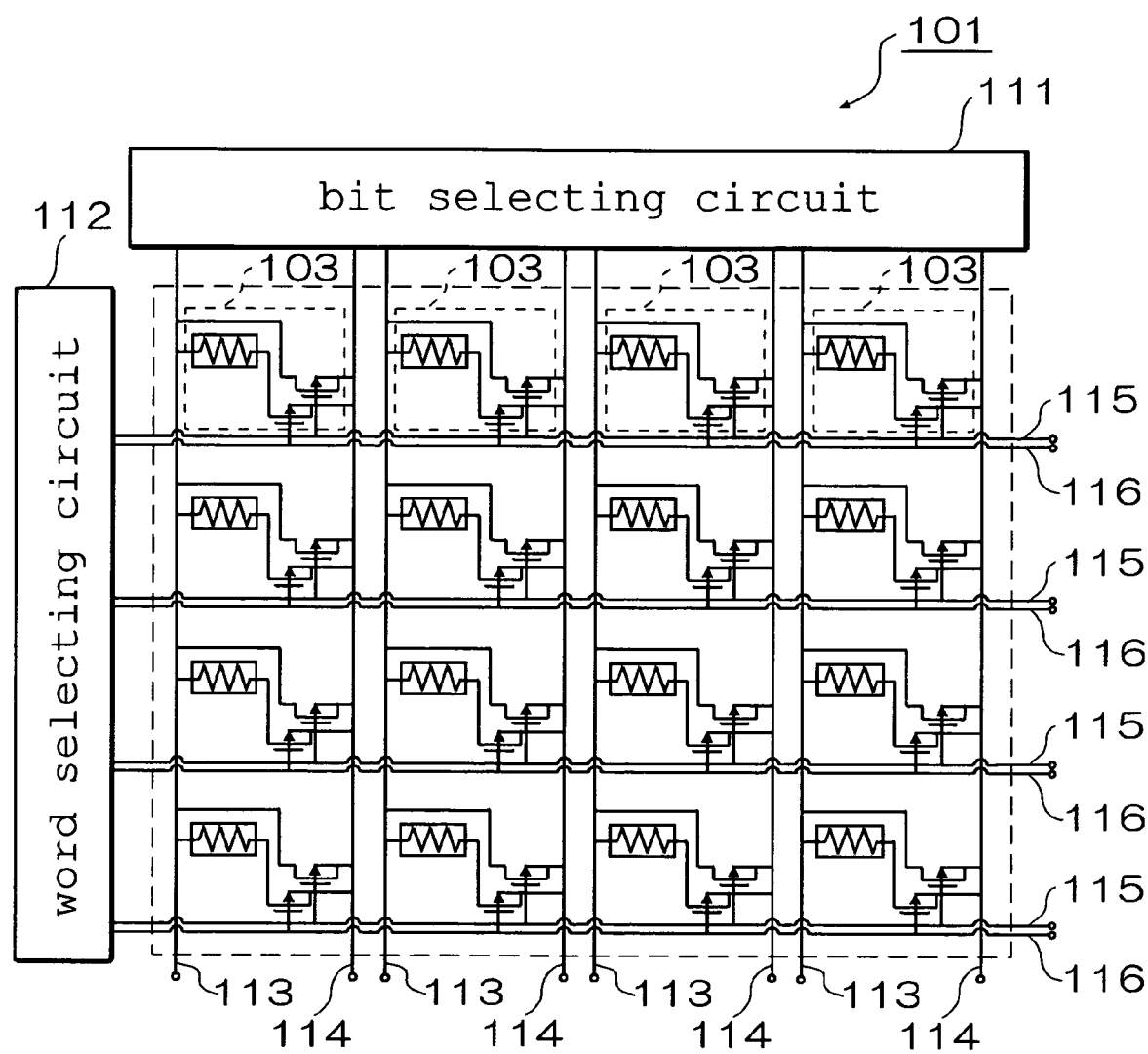
FIG. 16 is a conceptual diagram illustrating the whole structure of the magnetic memory contemplated by the second mode of embodiment of this invention.

In FIG. 16, a magnetic memory 101 constituting a second embodiment of the present invention is illustrated in its overall structure. Incidentally, the magnetic memory 101 will be described below as centered on the points in which it differs from the first embodiment. The parts and members thereof which are shared with the first embodiment will be omitted from the following description by resorting to the coincidence in the two least significant digits of relevant reference numerals.

Figure 17:
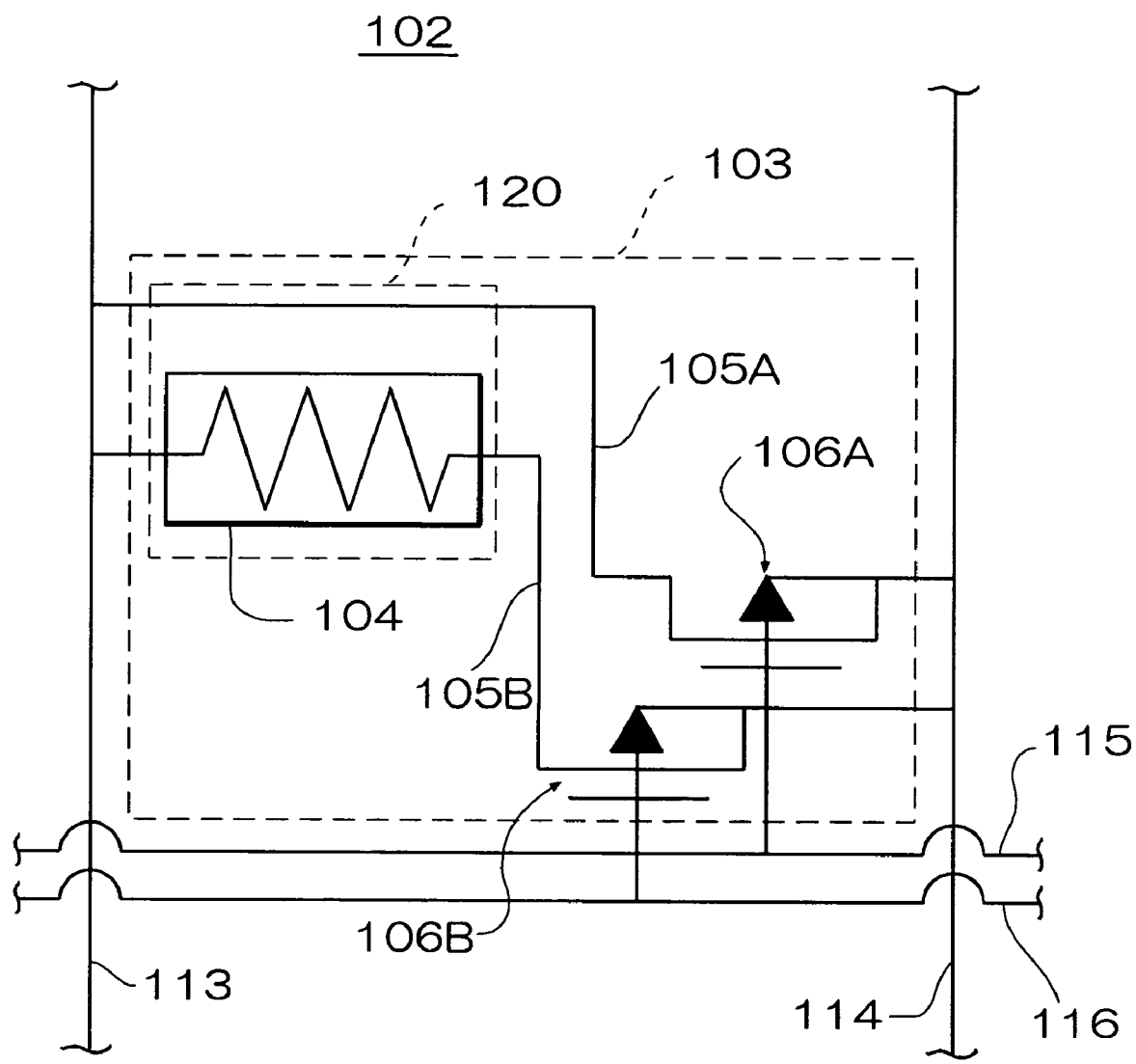
FIG. 17 is a conceptual diagram illustrating the memory cell of the magnetic memory in an enlarged scale.

An individual memory cell 103 of a memory part 102 in this magnetic memory 101 is furnished, as illustrated in an enlarged scale in FIG. 17, with a TMR element 104, a writing-grade wire 105A, a reading-grade wire 105B, a writing-grade transistor 106A, a reading-grade transistor 106B, etc. Unlike the first embodiment which utilizes combination reading-writing wires, the magnetic memory 101 of the second embodiment is adapted to abate such causes of noise as wraparound current by having the writing-grade wire 105A and the reading-grade wire 105B disposed separately from each other.

The opposite terminals of the writing-grade wire 105A are connected to two bit lines 113 and 114 and the writing-grade transistor 106 is interposed between these terminals. As a result, by applying an electric voltage between the bit lines 113 and 114 and turning the writing-grade transistor 106A on, it is made possible to supply the writing-grade wire 105A with an electric current and generate a magnetic field around the periphery of the adjacently disposed TMR element 104. Then, the opposite terminals of the reading-grade wire 105B are also connected to the two bit lines 113 and 114 and the reading-grade transistor 106B and the TMR element 104 are interposed between these terminals. As a result, by applying an electric voltage between the bit lines 113 and 114 and turning the reading-grade transistor 106B on, it is made possible to supply the reading-grade wire 105B with an electric current and detect a change in the magnitude of resistance of the TMR element 104. Incidentally, the writing-grade transistor 106A is connected to a word line 115 and the reading-grade transistor 106B is connected to a word line 116. By utilizing the electric voltage applied to the word lines 115 and 116, therefore, it is made possible to switch the states of continuity of the individual transistors 106A and 106B independently of each other. As a result, an electric current may be advanced as occasion demands from the bit lines 113 and 114 to the word line 115.

Figure 18:
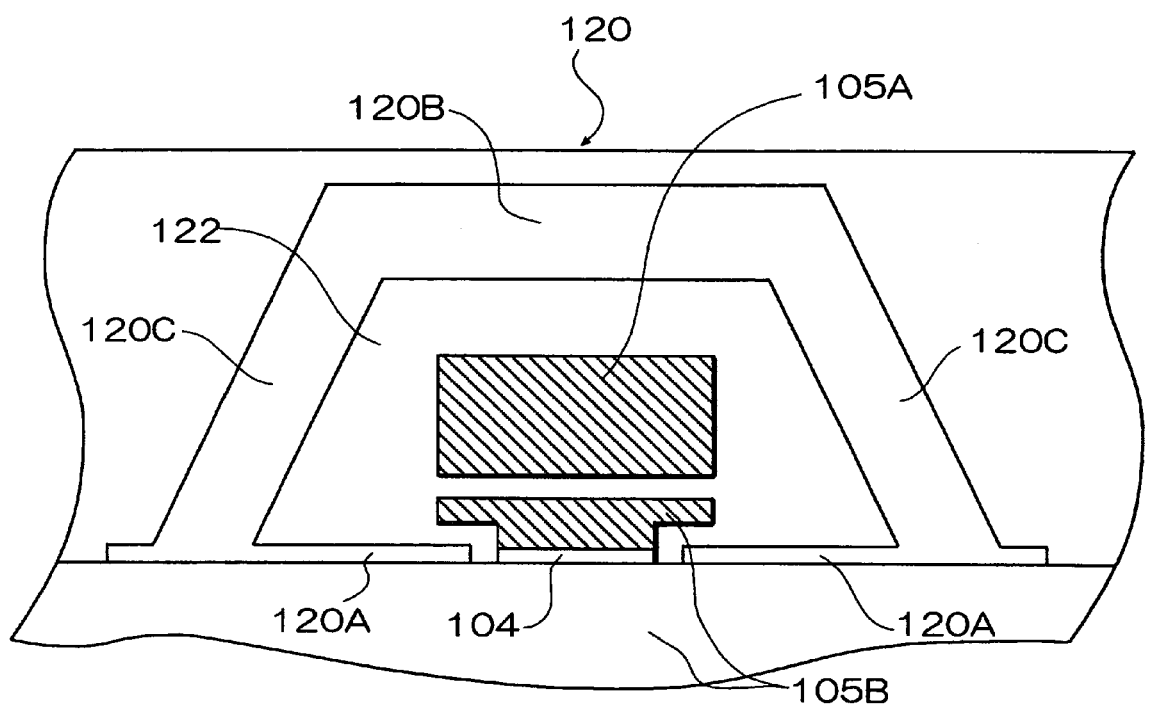
FIG. 18 is an enlarged cross section illustrating the inner structure of the memory cell.

In FIG. 18, a ferromagnetic yoke structure 120 is illustrated in an enlarged scale. This ferromagnetic yoke 120 is composed of an element side yoke 120A which is disposed adjacently to the TMR element 104 side in the writing-grade wire 105A, a counter element side yoke 120B which is disposed adjacently to the side opposite the TMR element 104 in the writing-grade wire 105A, and a pair of lateral part yokes 120C and 120C which are disposed so as to connect the opposite terminals of the element side yoke 120A and the opposite terminals of the counter element side yoke 120B substantially in a circumferential shape and pass the writing-grade wire 105A therethrough. Incidentally, in the gap which is formed in the element side yoke 120A, the TMR element 104 is disposed.

The TMR element 104 and the writing-grade wire 105A are set in a mutually insulated state by an insulator 122. Meanwhile, the upper end face and the lower end face of this TMR element 104 are connected to the reading-grade wire 105B. Incidentally, the reading-grade wire 105B is formed in a thin-film structure having such a downwardly convexed cross section in order that the writing-grade wire 105A and the TMR element 104 may approximate each other to the fullest possible extent. Incidentally, the detailed sizes of the ferromagnetic yoke structure 120 equal those in the first embodiment.

The magnetic memory 101 of this second embodiment can obtain the same effect as the first embodiment. Since the writing-grade wire 105A and the reading-grade wire 105B are independent of each other, the electric current can be advanced exclusively to the writing-grade wire 105A during the course of writing operation. Meanwhile, during the course of reading operation, the electric current can be advanced exclusively to the reading-grade wire 105B. As a result, the operations of writing and reading can be further stabilized because the wraparound current can be avoided without having to incorporate a diode, for example.

The magnetic memory contemplated by the first and second modes of embodiment has been described. This invention nevertheless does not need to be limited to any of the embodiments cited above but allows a varying modification. While the embodiment cited above used a TMR element as a magneto-resistivity effect element, a GMR element utilizing giant magneto-resistivity effect (GMR) may be used instead, for example. The term "GMR effect" means a phenomenon that the magnitude of resistance of a ferromagnetic layer in the direction perpendicular to the direction of lamination is varied by the angle formed by the directions of magnetization of two ferromagnetic layers including a nonmagnetic layer. That is, in the GMR element, the magnitude of resistance of the ferromagnetic layer is minimized when the directions of magnetization of the two ferromagnetic layers are parallel to each other and maximized when the directions of magnetization of the two ferromagnetic layers are not parallel to each other. Incidentally, the TMR element and the GMR element are each known in two types, i.e. a para-spin bulb type which effects writing/reading by making use of the difference of coercive force between the two ferromagnetic layers and a spin bulb type which fixes the direction of magnetization of one of the ferromagnetic layers by exchange coupling with the antiferromagnetic layer. Then, the reading of data in the GMR element is effected by detecting the magnitude of resistance of the ferromagnetic layer in the direction perpendicular to the direction of lamination. The writing of data in the GMR element is effected by inverting the direction of magnetization of one of the ferromagnetic layers by the magnetic field produced by the writing electric current.

In the preceding mode of embodiment, the transistor (combination reading-writing transistor) was used as a switching means for controlling the writing electric current and the reading electric current. As the switching means, a varying means which is endowed with the function of putting on/off continuity of electric current may be adopted as occasion demands.

The magnetic memory contemplated by this invention does not need to be limited to the mode of embodiment cited above and is naturally allowed to incorporate a varying modification without departing from the spirit of the invention.

This invention can be extensively utilized in such a field as recording and retaining various information by means of the magneto-resistivity effect element.

The entire disclosure of Japanese Patent Application No. 2005-217141 filed on Jul. 27, 2005 including specification, claims, drawings, and summary are incorporated herein by reference in its entirety.

What is claimed is:

1. A magnetic memory, characterized by comprising
  a wire extended in a direction of arbitrary decision,
  a magneto-resistivity effect element disposed adjacently to said wire, and
  a counterelement side yoke disposed adjacently to the side opposite said magneto-resistivity effect element in said wire, and causing
  the size of said counterelement side yoke along the longer direction of the wire to be larger than one half and smaller than two times of the size of said counterelement side yoke along the crosswise direction of the wire.

2. A magnetic memory, characterized by comprising
  a wire extended in a direction of arbitrary decision,
  a magneto-resistivity effect element disposed adjacently to said wire, and
  an element side yoke disposed adjacently on the same side as said maneto-resistivity effect element in said wire, and satisfying the formula, 2.5<A/B<7.5 wherein A denotes the thickness of said element side yoke and B the thickness of said magneto-resitivity effect element.

3. A magnetic memory, characterized by comprising
a wire extended in a direction of arbitrary decision,
a magneto-resistivity effect element disposed adjacently to said wire, and
an element side yoke disposed adjacently on the same side as said magneto-resistivity effect element in said wire, and causing
the size of said element side yoke along the longer direction of the wire to be so set as to be larger than one time of the size of said magneto-resistivity effect element along the longer direction of the wire and smaller than five times of the size of said magneto-resistivity effect element along the longer direction of the wire.

4. A magnetic memory, characterized by comprising
a wire extended in a direction of arbitrary decision,
a magneto-resistivity effect element disposed adjacently to said wire, and
a yoke structure disposed along the circumferential direction of said wire, and causing
the counterelement side yoke constituting the side opposite said magneto-resistivity effect element in said yoke structure to have a thickness larger than the thickness of the element side yoke constituting the neighborhood of said magneto-resistivity effect element in said yoke structure.

5. A magnetic memory according to claim 4, wherein
the thickness of said counterelement side yoke is so set as to be larger than 50 nm and smaller than 150 nm and
the thickness of said element side yoke is so set as to be larger than 10 nm and smaller than 30 nm.

6. A magnetic memory comprising
a wire extended in a direction of arbitrary decision,
a magneto-resistivity effect element disposed adjacently to said wire, and
a yoke structure disposed along the circumferential direction of said wire, furnished with a gap in part of said circumferential direction, and enabled to accommodate said magneto-resistivity effect element in said gap, and causing
the largest outer size of said yoke structure along the longer direction of wire to be so set as to be larger than one half and smaller than two times of the largest outer size of said yoke structure along the crosswise direction of the wire.

7. A magnetic memory according to claim 6, wherein
the size of said element side yoke along the longer direction of the wire, constituting the neighborhood of said magneto-resistivity effect element in said yoke structure is so set as to be larger than one time of the size of said magneto-resistivity effect element along the longer direction of said wire and smaller than five times of the size of said magneto-resistivity effect element along the longer direction of said wire.

8. A magnetic memory comprising
a wire extended in a direction of arbitrary decision,
a magneto-resistivity effect element disposed adjacently to said wire, and
a counterelement side yoke disposed adjacently to the side opposite said magneto-resistivity effect element in said wire, and
an element side yoke disposed adjacently on the same size as said magneto-resistivity effect element in said wire, and causing
the thickness of said element side yoke to be so set as to be larger than the thickness of said counterelement side yoke.

9. A magnetic memory according to claim 8, wherein the thickness of said counterelement side yoke is so set as to be larger than 50 nm and smaller than 150 nm and the thickness of said element side yoke is so set as to be larger than 10 nm and smaller than 30 nm.

10. A magnetic memory comprising
a wire extended in a direction of arbitrary decision,
a magneto-resistivity effect element disposed adjacently in the neighborhood of said wire, and
an element side yoke disposed adjacently on the same size as said magneto-resistivity effect element in said wire, and causing
the size of said element side yoke along the longer direction of the wire to be so set as to be larger than one time of the size of said magneto-resistivity effect element along the longer direction of the wire and smaller than five times of the size of said magneto-resistivity effect element along the longer direction of the wire.

11. A magnetic memory according to claim 8, which further comprises a pair of lateral part yoke for connecting the neighborhoods of the opposite terminals of said element side yoke and the neighborhoods of the opposite terminals of said counterelement side yoke.

12. A magnetic memory according to claim 9, which further comprises a pair of lateral part yoke for connecting the neighborhoods of the opposite terminals of said element side yoke and the neighborhoods of the opposite terminals of said counterelement side yoke.

13. A magnetic memory according to claim 10, which further comprises a pair of lateral part yoke for connecting the neighborhoods of the opposite terminals of said element side yoke and the neighborhoods of the opposite terminals of said counterelement side yoke.

14. A magnetic memory comprising
a wire extended in a direction of arbitrary decision,
a magneto-resistivity effect element disposed adjacently to said wire, and
a counterelement side yoke disposed adjacently to the side opposite said magneto-resistivity effect element in said wire,
an element side yoke disposed adjacently on the same size as said magneto-resistivity effect element in said wire, and
a pair of lateral part yokes for connecting the neighborhoods of the opposite terminals of said element side yoke and the neighborhoods of the opposite terminals of said counterelement side yoke, and causing
the outer size of said element side yoke along the longer direction of said wire to be so set as to be larger than one half and smaller than two times of the distance between said pair of lateral part yokes.

* * * * *